(12) United States Patent
Hemink et al.

(10) Patent No.: US 7,596,031 B2
(45) Date of Patent: Sep. 29, 2009

(54) FASTER PROGRAMMING OF HIGHEST MULTI-LEVEL STATE FOR NON-VOLATILE MEMORY

(75) Inventors: Gerrit Jan Hemink, Yokohama (JP); Shih-Chung Lee, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 336 days.

(21) Appl. No.: 11/554,223

(22) Filed: Oct. 30, 2006

(65) Prior Publication Data

US 2008/0101126 A1    May 1, 2008

(51) Int. Cl.
*G11C 16/04*    (2006.01)

(52) U.S. Cl. .............. 365/185.19; 365/185.03; 365/185.18; 365/185.22

(58) Field of Classification Search ............ 365/185.03, 365/185.18, 185.19, 185.22
See application file for complete search history.

(56) References Cited

U.S. PATENT DOCUMENTS

| | | | |
|---|---|---|---|
| 5,043,940 A | 8/1991 | Harari |
| 5,172,338 A | 12/1992 | Mehrotra |
| 5,386,422 A | 1/1995 | Endoh et al. |
| 5,467,306 A | 11/1995 | Kaya et al. |
| 5,570,315 A | 10/1996 | Tanaka et al. |
| 5,621,684 A | 4/1997 | Jung et al. |
| 5,671,176 A | 9/1997 | Jang et al. |
| 5,677,873 A | 10/1997 | Choi et al. |
| 5,715,194 A | 2/1998 | Hu |
| 5,748,538 A | 5/1998 | Lee et al. |
| 5,774,397 A | 6/1998 | Endoh |
| 5,776,810 A | 7/1998 | Guterman et al. |
| 5,818,757 A | 10/1998 | So |
| 5,867,429 A | 2/1999 | Chen et al. |
| 5,887,145 A | 3/1999 | Harari |
| 5,973,962 A | 10/1999 | Kwon |
| 5,986,929 A | 11/1999 | Sugiura et al. |
| 5,991,202 A | 11/1999 | Derhacobian et al. |
| 6,011,287 A | 1/2000 | Itoh et al. |
| 6,028,788 A | 2/2000 | Choi et al. |
| 6,046,935 A | 4/2000 | Takeuchi et al. |
| 6,049,494 A | 4/2000 | Sakui et al. |
| 6,061,270 A | 5/2000 | Choi |
| 6,107,658 A | 8/2000 | Itoh |

(Continued)

FOREIGN PATENT DOCUMENTS

WO    2006107796 A    10/2006

OTHER PUBLICATIONS

J.D. Choi, et al., A Novel Booster Plate Technology in High Density NAND Flash Memories for Voltage Scaling-Down and Zero Program Disturbance, 1996 Symposium on VLSI Technology Digest of Technical Papers, pp. 238-239.

(Continued)

*Primary Examiner*—VanThu Nguyen
(74) *Attorney, Agent, or Firm*—Vierra Magen Marcus & DeNiro LLP

(57) ABSTRACT

A coarse/fine programming technique is used for programming to lower states while using a standard technique (not coarse/fine programming) for programming to the highest state(s). However, when the programming of the lower states is finished, a number of programming pulses are still needed to program the highest state. To improve the programming speed, a bigger step size and longer programming pulse can be used from the moment that the lowest states have been programmed. At the same time, the programming technique for the highest state can be changed to a coarse/fine programming technique.

49 Claims, 13 Drawing Sheets

U.S. PATENT DOCUMENTS

| | | | |
|---|---|---|---|
| 6,108,238 | A | 8/2000 | Nakamura et al. |
| 6,134,157 | A | 10/2000 | Takeuchi |
| 6,181,599 | B1 | 1/2001 | Gongwer |
| 6,222,762 | B1 | 4/2001 | Guterman et al. |
| 6,228,782 | B1 | 5/2001 | Fang et al. |
| 6,236,609 | B1 | 5/2001 | Tanzawa et al. |
| 6,243,295 | B1 | 6/2001 | Satoh |
| 6,307,807 | B1 | 10/2001 | Sakui et al. |
| 6,314,026 | B1 | 11/2001 | Satoh et al. |
| 6,353,555 | B1 | 3/2002 | Jeong |
| 6,363,010 | B2 | 3/2002 | Tanaka et al. |
| 6,370,081 | B1 | 4/2002 | Sakui et al. |
| 6,381,178 | B1 * | 4/2002 | Kodama ............... 365/185.28 |
| 6,411,551 | B1 | 6/2002 | Kim et al. |
| 6,442,080 | B2 | 8/2002 | Tanzawa et al. |
| 6,456,528 | B1 | 9/2002 | Chen |
| 6,469,933 | B2 | 10/2002 | Choi et al. |
| 6,480,419 | B2 | 11/2002 | Lee |
| 6,493,265 | B2 | 12/2002 | Satoh et al. |
| 6,504,757 | B1 | 1/2003 | Holmer et al. |
| 6,512,703 | B2 | 1/2003 | Sakui et al. |
| 6,522,580 | B2 | 2/2003 | Chen et al. |
| 6,522,583 | B2 | 2/2003 | Kanda et al. |
| 6,525,964 | B2 | 2/2003 | Tanaka |
| 6,580,639 | B1 | 6/2003 | He et al. |
| 6,614,688 | B2 | 9/2003 | Jeong et al. |
| 6,657,892 | B2 | 12/2003 | Sakui et al. |
| 6,661,707 | B2 | 12/2003 | Choi et al. |
| 6,680,865 | B2 | 1/2004 | Watanabe |
| 6,804,150 | B2 | 10/2004 | Park et al. |
| 6,859,394 | B2 | 2/2005 | Matsunaga et al. |
| 6,859,395 | B2 | 2/2005 | Matsunaga et al. |
| 6,859,397 | B2 | 2/2005 | Lutze et al. |
| 6,888,758 | B1 | 5/2005 | Hemink et al. |
| 6,917,542 | B2 | 7/2005 | Chen et al. |
| 6,977,842 | B2 | 12/2005 | Nazarian |
| 7,120,051 | B2 | 10/2006 | Gorobets et al. |
| 7,173,859 | B2 * | 2/2007 | Hemink ............... 365/185.28 |
| 7,259,976 | B2 * | 8/2007 | Lee et al. ............... 365/3 |
| 7,426,138 | B1 * | 9/2008 | Wong ............... 365/185.03 |
| 7,450,426 | B2 * | 11/2008 | Li et al. ............... 365/185.19 |
| 7,474,561 | B2 * | 1/2009 | Li et al. ............... 365/185.17 |
| 2002/0110019 | A1 | 8/2002 | Satoh |
| 2003/0147278 | A1 | 8/2003 | Tanaka |
| 2004/0145024 | A1 | 7/2004 | Chen et al. |
| 2004/0255090 | A1 | 12/2004 | Guterman et al. |
| 2005/0157552 | A1 | 7/2005 | Hemink et al. |
| 2005/0174852 | A1 | 8/2005 | Hemink |
| 2005/0226055 | A1 | 10/2005 | Guterman |
| 2005/0276101 | A1 | 12/2005 | Chen et al. |

OTHER PUBLICATIONS

Takeuchi, et al., A Source-line Programming Scheme for Low Voltage Operation NAND Flash Memories, 1998 Symposium on VLSI Circuits Digest of Technical Papers, pp. 37-38.

Kang-Deog Suh, et al., A 3.3V 32Mb NAND Flash Memory with Incremental Step Pulse Programming Scheme, pp. 128-129, 1995 IEEE International Solid State Circuits Conference.

International Search Report and Written Opinion dated Apr. 29, 2008 in PCT Application No. PCT/US2007/081419.

S. Aritome et al., "Reliability Issues of Flash Memory Cells," Proceedings of the IEEE, New York, vol. 81, No. 5, May 1, 1993, pp. 776-788.

Jung, et al., "A 3.3V 128Mb Multi-Level NAND Flash Memory for Mass Storage Applications," ISSCC96, Session 2, Flash Memory, Paper TP 2.1, IEEE, pp. 32-33, slide supplement pp. 20-21, 346-347 (1996).

Jung, et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

A. Modelli et al., "Basic feasibility constraints for multilevel CHE-programmed flashmemories," IEE Trans. on Electron Devices, vol. 48, No. 9, Sep. 2001, pp. 2032-2042.

T. Nozaki, et al., "A 1-Mb EEPROM with MONOS Memory Cell for Semiconductor Disk Application," IEEE Journal of Solid-State Circuits, vol. 26, No. 4 Apr. 1991, pp. 497-501.

U.S. Appl. No. 11/313,023, filed Dec. 19, 2005, titled, "Method for Programming Non-volatile Memory with Reduced Program Disturb Using Modified Pass Voltage," by Hemink.

U.S. Appl. No. 11/312,925, filed Dec. 19, 2005, titled, "Apparatus for Programming Non-volatile Memory with Reduced Program Disturb Using Modified Pass Voltages," by Hemink.

* cited by examiner

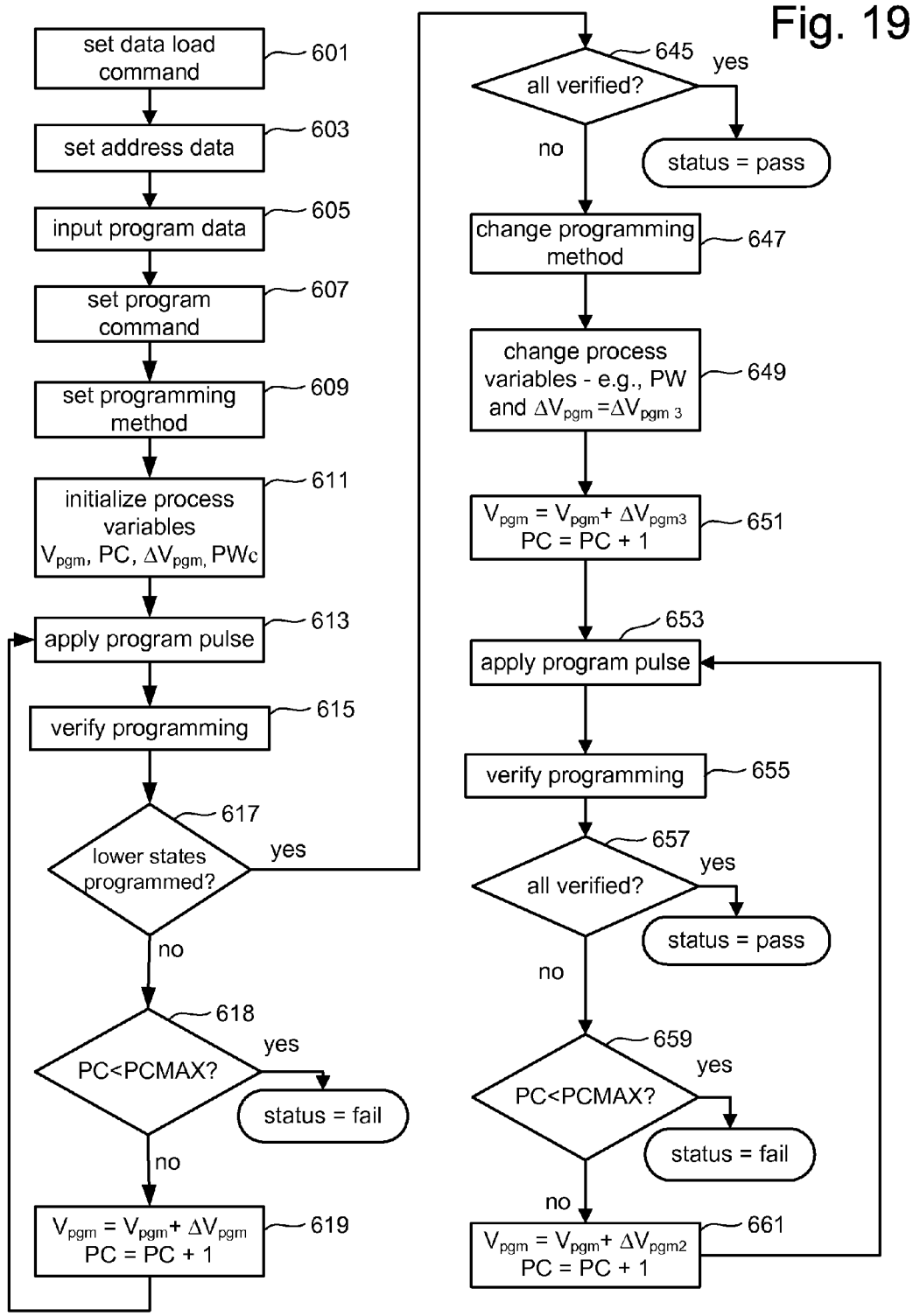

FASTER PROGRAMMING OF HIGHEST MULTI-LEVEL STATE FOR NON-VOLATILE MEMORY

BACKGROUND

The present disclosure relates to programming of non-volatile memory.

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a transistor structure having a floating gate that is positioned above and insulated from the channel region in a semiconductor substrate, as well as between the source and drain regions. A control gate is provided over and insulated from the floating gate. The threshold voltage Vt of the transistor is controlled by the amount of charge that is retained on the floating gate. That is, the minimum amount of voltage that must be applied to the control gate before the transistor is turned on to permit conduction between its source and drain is controlled by the level of charge on the floating gate.

The floating gate can be used to store two ranges of charges, and therefore, the transistor provides a memory element having two possible states, e.g., an erased state and a programmed state. Such a flash memory device is sometimes referred to as a binary flash memory device because each memory element can store one bit of data.

A multi-state or multi-level flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{pgm}$ is applied to the control gate during a program operation as a waveform or series of pulses that increase in magnitude over time. In one possible approach, the magnitude of the pulses is increased with each successive pulse by a predetermined step size on the order of 0.2-0.4 V. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{pgm}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397 entitled Source Side Self Boosting Technique For Non-Volatile Memory, and in U.S. Patent Publication No. 2005/0024939 entitled Detecting Over Programmed Memory, both of which are incorporated herein by reference in their entirety.

In multi-level storage devices, various programming techniques can be used to enhance performance in terms of obtaining narrower programmed threshold voltage distributions and higher programming speeds. For example, a coarse/fine programming technique can be used in which an intermediate bit line voltage is applied to storage elements that have reached a specified verify level which is less than the final verify level. This slows down programming so that the threshold voltage distributions can be more precisely controlled.

As with other electronic devices, there is a consumer demand for memory devices to program as fast as possible. For example, the user of a digital camera that stores images on a flash memory card does not want to wait between pictures for an unnecessary long period of time. In addition to programming with reasonable speed, to achieve proper data storage for a multi-state memory cell, the multiple ranges of threshold voltages of the multi-state memory cells should be separated from each other by sufficient margin so that the level of the memory cell can be programmed and read in an unambiguous manner. A tight threshold voltage distribution is recommended. To achieve a tight threshold voltage distribution, small program steps have typically been used, thereby programming the threshold voltage of the cells more slowly. The tighter the desired threshold voltage distribution, the smaller the steps and the slower the programming process.

Typically, in order to maintain reasonable programming times, coarse/fine programming algorithms are not applied to the highest memory state (the state corresponding to the largest positive threshold voltage range). The highest state does not need to be differentiated from a higher state. Typically, it is only necessary to program cells for the highest state above a minimum threshold level to differentiate from the next lowest state. Thus, the distribution of these cells can occupy a wider threshold voltage range without adverse effects on device performance. Coarse/fine programming methodologies require more verify steps as described above. Moreover, the use of coarse/fine programming methodologies may increase the total number of required programming pulses. Since the highest threshold voltage state does not require as tight a threshold voltage distribution in most cases, coarse/fine programming is typically not used so as to decrease overall programming times.

In addition to increased programming times, the use of coarse/fine programming methodology for the highest threshold voltage state can increase the occurrence of program disturb within flash memory devices implemented with the NAND architecture (described more fully hereinafter). To apply a program voltage to the control gate of a selected cell on a selected NAND string, the program voltage is applied on the appropriate word line. This word line will also be connected to a memory cell on every other NAND string in the selected block of memory cells. Some of these memory cells may not be intended for programming. A problem arises when one desires to program one cell on a word line without programming other cells connected to the same word line. Because the program voltage is applied to all cells connected to a word line, an unselected cell (a cell that is not to be programmed) connected to the word line may become inadvertently programmed. The unintentional programming of the unselected cell on the selected word line is referred to as "program disturb."

While various techniques exist for eliminating or limiting program disturb, some device architects choose not to use coarse/fine programming algorithms for the highest threshold voltage memory state in order to decrease the potential for program disturb. Program disturb occurs most often under application of large program voltages to a word line. The increased number of programming pulses required by coarse/fine programming can lead to the program voltage reaching a higher level than would be reached were coarse/fine programming not used. Accordingly, some implementations of the NAND architecture do not apply coarse/fine programming for the highest threshold voltage state to minimize the occurrence of program disturb.

SUMMARY

A coarse/fine programming technique is used for programming to lower states while using a standard technique (not coarse/fine programming) for programming to the highest state(s). However, when the programming of the lower states is finished, a number of programming pulses are still needed to program the highest state. To improve the programming speed, a bigger step size and longer programming pulse can be used from the moment that the lowest states have been programmed. At the same time, the programming technique for the highest state can be changed to a coarse/fine programming technique.

A better understanding of the features and advantages of the present invention will be obtained by reference to the following detailed description of the invention and the accompanying drawings which set forth an illustrative embodiment in which the principles of the invention are utilized.

BRIEF DESCRIPTION OF THE DRAWINGS

FIGS. 18 and 19 are flow charts describing a process for programming non-volatile memory according to the embodiments of FIGS. 14-15 respectively.

DETAILED DESCRIPTION

Figure 1:
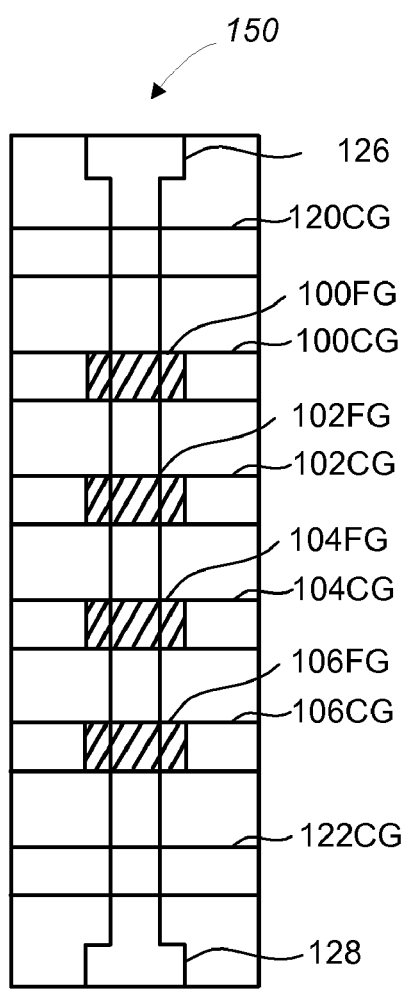
FIG. 1 is a top view of a NAND string.
Figure 2:
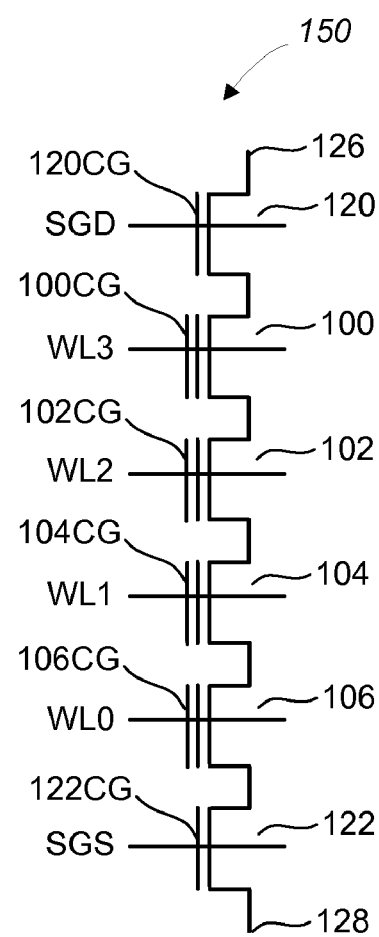
FIG. 2 is an equivalent circuit diagram of the NAND string.

One embodiment of a semiconductor memory system uses the NAND flash memory structure, which includes arranging multiple transistors in series between two select gates in a NAND string. FIG. 1 is a top view showing one such NAND string 150. FIG. 2 is an equivalent circuit thereof. The NAND string depicted in FIGS. 1 and 2 includes four transistors, 100, 102, 104 and 106, arranged in series between a first select gate 120 and a second select gate 122. First select gate 120 gates the connection of NAND string 150 to bit line 126. Second select gate 122 gates the connection of NAND string 150 to source line 128. First select gate 120 is controlled by applying the appropriate voltages to control gate 120CG. Second select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 has control gate 102CG and floating gate 102FG. Transistor 104 has control gate 104CG and floating gate 104FG. Transistor 106 has control gate 106CG and floating gate 106FG.

Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are used as memory cells. In other embodiments, the memory cells may include multiple transistors or may be different than depicted in FIGS. 1 and 2. First select gate 120 is connected to the drain select line SGD. Second select gate 122 is connected to the source select line SGS.

Note that although FIGS. 1-2 show four memory cells in the NAND string, the use of four transistors is illustrative only, and other configurations could readily be provided, including common configurations for 8 memory cells, 16 memory cells, 32 memory cells, 64 memory cells, etc.

Figure 3:
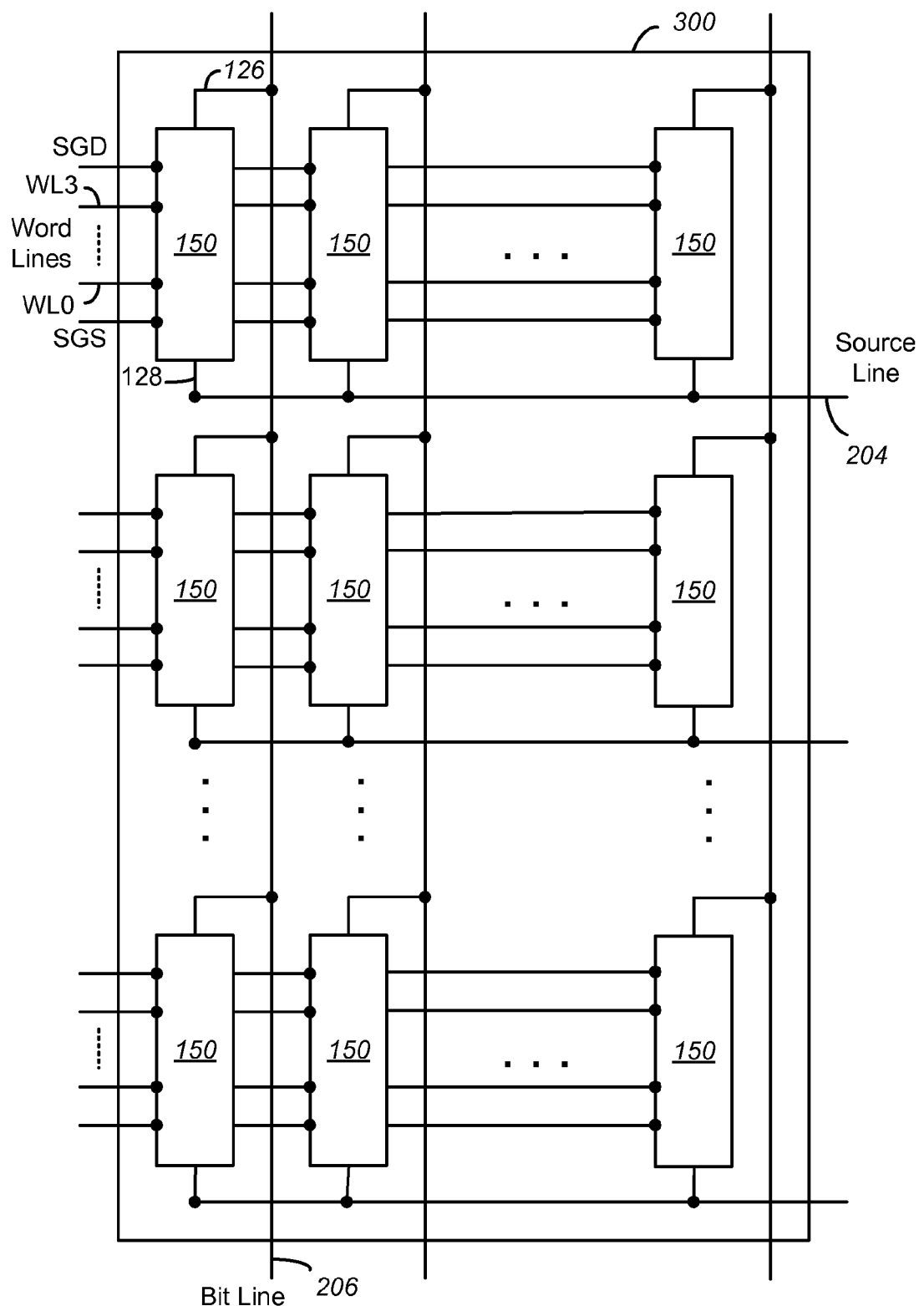
FIG. 3 is a block diagram of a portion of an array of NAND flash memory cells.

FIG. 3 illustrates an example of an array of NAND cells, such as those shown in FIGS. 1-2. Along each column, a bit line 206 is coupled to the drain terminal 126 of each drain select gate 120 for the NAND string 150. Along each row of NAND strings, a source line 204 may connect each of the source terminals 128 of the source select gates 122 of the NAND strings. Relevant examples of NAND-type flash memories and their operation are provided in the following United States patents, each of which is incorporated herein by reference in its entirety: U.S. Pat. No. 5,386,422; U.S. Pat. No. 5,570,315; U.S. Pat. No. 5,774,397; U.S. Pat. No. 6,046,935; U.S. Pat. No. 6,456,528; and U.S. Pat. No. 6,522,580.

The array of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages.

Figure 4:
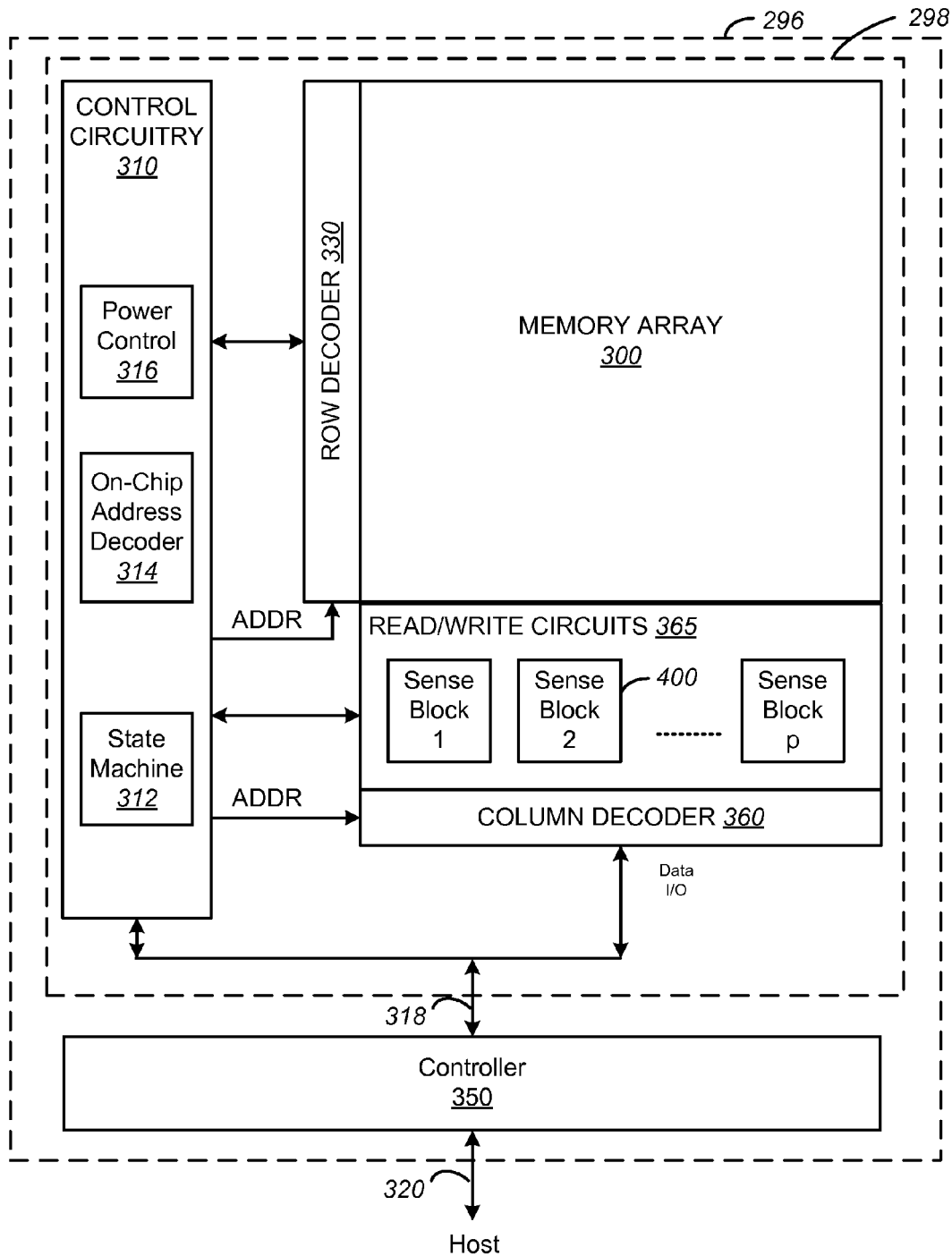
FIG. 4 is a block diagram of a non-volatile memory system.

FIG. 4 illustrates one embodiment of a memory device 296 having read/write circuits for reading and programming a page of memory cells in parallel. Memory device 296 may include one or more memory die 298. Memory die 298 includes a two-dimensional array of memory cells 300, control circuitry 310, and read/write circuits 365. In some embodiments, the array of memory cells can be three dimensional. The memory array 300 is addressable by word lines via a row decoder 330 and by bit lines via a column decoder 360. The read/write circuits 365 include multiple sense blocks 400 and allow a page of memory cells to be read or programmed in parallel. Typically, a controller 350 is included in the same memory device 296 (e.g., a removable storage card) as the one or more memory die 298. Commands and data are transferred between the host and controller 350 via lines 320 and between the controller and the one or more memory die 298 via lines 318.

The control circuitry 310 cooperates with the read/write circuits 365 to perform memory operations on the memory array 300. The control circuitry 310 includes a state machine 312, an on-chip address decoder 314 and a power control module 316. The state machine 312 provides chip-level control of memory operations. The on-chip address decoder 314 provides an address interface between that used by the host or a memory controller to the hardware address used by the decoders 330 and 360. The power control module 316 controls the power and voltages supplied to the word lines and bit lines during memory operations.

In some implementations, some components of FIG. 4 can be combined. In various designs, one or more of the components of FIG. 4 (alone or in combination), other than memory cell array 300, can be thought of as a managing circuit. For example, a managing circuit may include any one of or a combination of control circuitry 310, state machine 312, decoders 314/360, power control 316, sense blocks 400, read/write circuits 365, controller 350, etc.

Figure 5:
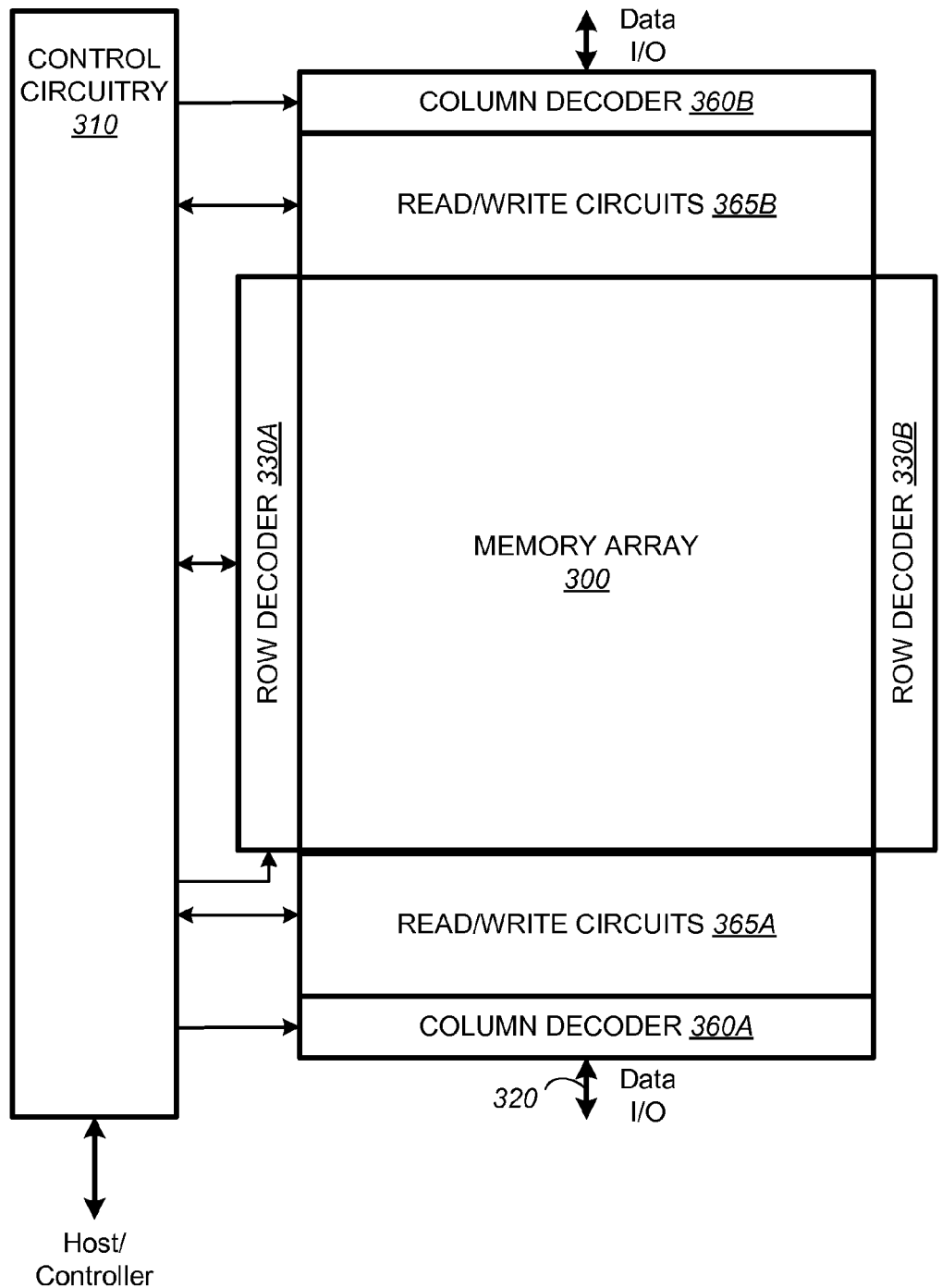
FIG. 5 is a block diagram of a non-volatile memory system.

FIG. 5 illustrates another arrangement of the memory device 296 shown in FIG. 4. Access to the memory array 300 by the various peripheral circuits is implemented in a symmetric fashion, on opposite sides of the array, so that the densities of access lines and circuitry on each side are reduced by half. Thus, the row decoder is split into row decoders 330A and 330B and the column decoder into column decoders 360A and 360B. Similarly, the read/write circuits are split into read/write circuits 365A connecting to bit lines from the bottom and read/write circuits 365B connecting to bit lines from the top of the array 300. In this way, the density of the read/write modules is essentially reduced by one half. The device of FIG. 5 can also include a controller, as described above for the device of FIG. 4.

Figure 6:
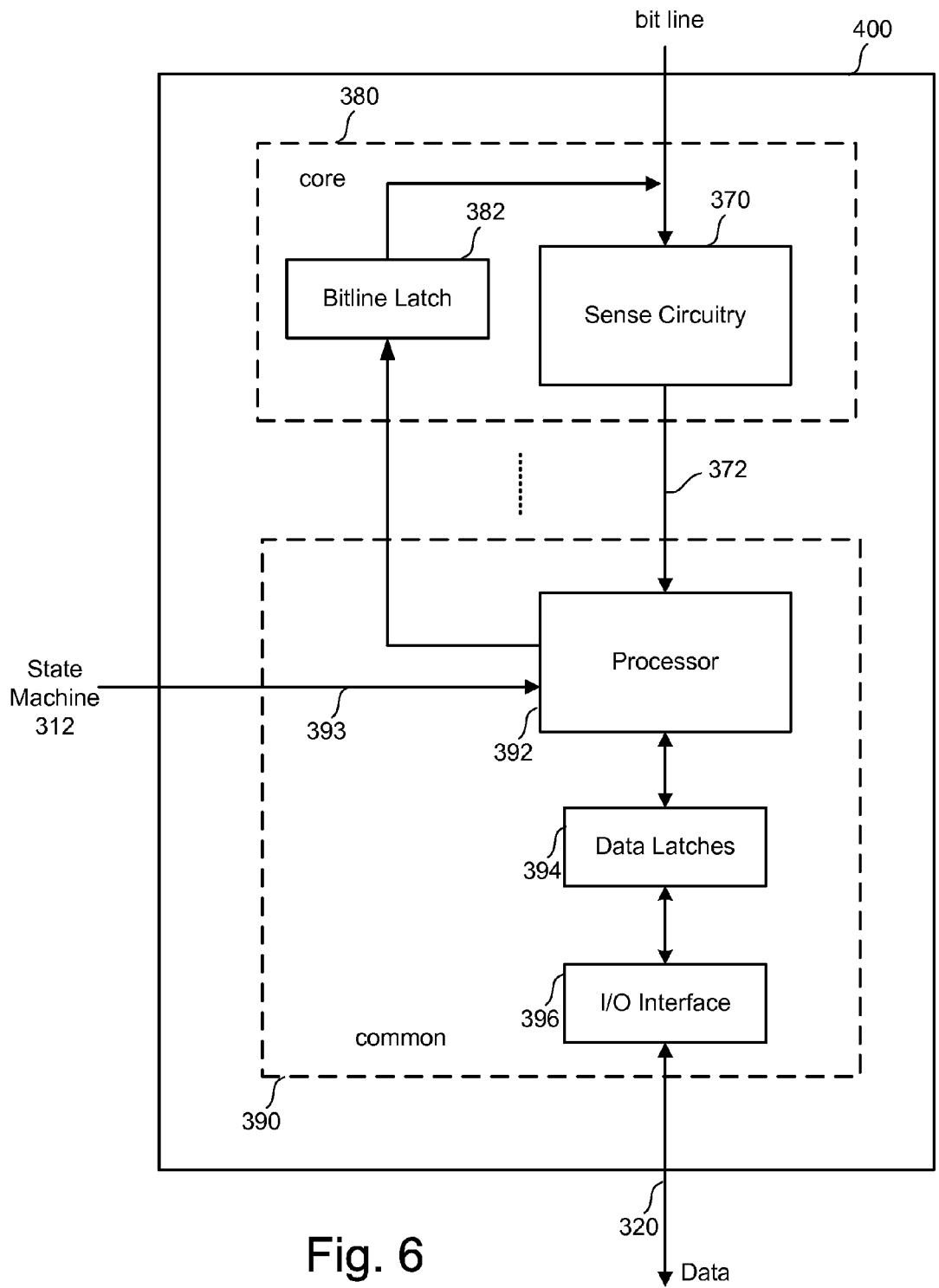
FIG. 6 is a block diagram depicting one embodiment of the sense block.

FIG. 6 is a block diagram of an individual sense block 400 partitioned into a core portion, referred to as a sense module 380, and a common portion 390. In one embodiment, there will be a separate sense module 380 for each bit line and one common portion 390 for a set of multiple sense modules 380. In one example, a sense block will include one common portion 390 and eight sense modules 380. Each of the sense modules in a group will communicate with the associated common portion via a data bus 372. For further details, refer to U.S. Patent Publication No. 2006/0140007 entitled Non-Volatile Memory & Method with Shared Processing for an Aggregate of Sense Amplifiers, which is incorporated herein by reference in its entirety.

Sense module 380 includes sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., $V_{dd}$).

Common portion 390 includes a processor 392, a set of data latches 394 and an I/O interface 396 coupled between the set of data latches 394 and data bus 320. Processor 392 performs computations. For example, one of its functions is to determine the data stored in the sensed memory cell and store the determined data in the set of data latches. The set of data latches 394 is used to store data bits determined by processor 392 during a read operation. It is also used to store data bits imported from the data bus 320 during a program operation. The imported data bits represent write data meant to be programmed into the memory. I/O interface 396 provides an interface between data latches 394 and the data bus 320.

During read or sensing, the operation of the system is under the control of state machine 312, which controls the supply of different control gate voltages to the addressed cell. As it steps through the various predefined control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above.

It is anticipated that some implementations will include multiple processors 392. In one embodiment, each processor 392 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine needs to read the wired-OR line eight times, or logic is added to processor 392 to accumulate the results of the associated bit lines such that the state machine need only read the wired-OR line one time.

During program or verify, the data to be programmed is stored in the set of data latches 394 from the data bus 320. The program operation, under the control of the state machine 312, comprises a series of programming voltage pulses applied to the control gates of the addressed memory cells as further described below. Each programming pulse is followed by a verify operation to determine if the memory cell has been programmed to the desired state. Processor 392 monitors the verified memory state relative to the desired memory state. When the two are in agreement, the processor 392 sets the bit line latch 382 so as to cause the bit line to be pulled to a state designating program inhibit. This inhibits the cell coupled to the bit line from further programming even if programming pulses appear on its control gate. In other embodiments, the processor initially loads the bit line latch 382 and the sense circuitry sets it to an inhibit value during the verify process.

Data latch stack 394 contains a stack of data latches corresponding to the sense module. In one embodiment, there are three data latches per sense module 380. In some implementations (but not required), the data latches are implemented as a shift register so that the parallel data stored therein is converted to serial data for data bus 320, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in the following patent references, which are incorporated herein by reference in their entirety: U.S. Pat. No. 7,023,736 entitled Non-Volatile Memory And Method with Improved Sensing; U.S. Pat. No. 7,046,568 entitled Improved Memory Sensing Circuit And Method For Low Voltage Operation; U.S. Patent Publication No. 2004/0057287 entitled Non-Volatile Memory And Method With Reduced Source Line Bias Errors; U.S. Patent Publication No. 2006/0158947 entitled Reference Sense Amplifier For Non-Volatile Memory; and U.S. patent application Ser. No. 11/099,133 entitled Compensating for Coupling During Read Operations of Non-Volatile Memory.

Figure 7:
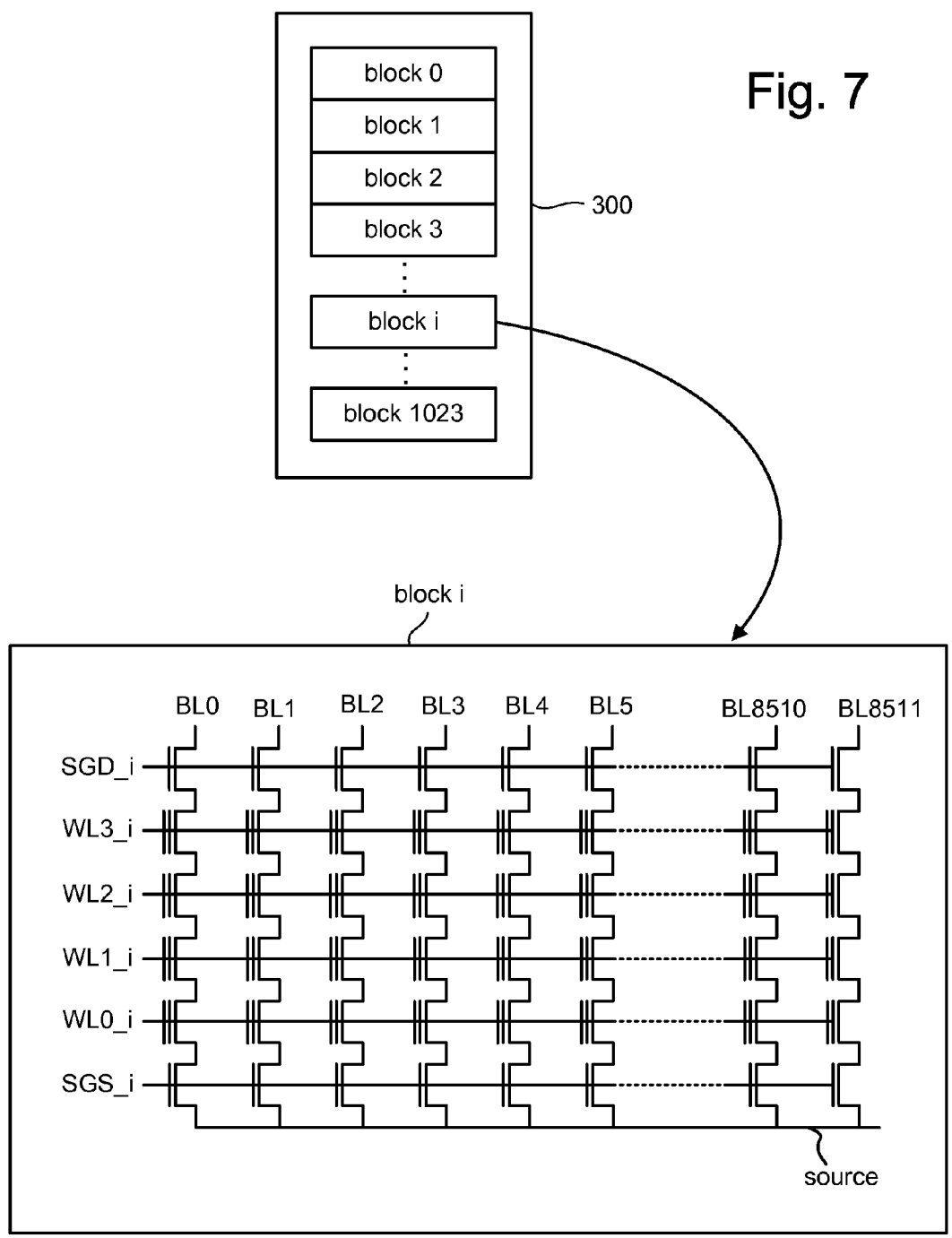
FIG. 7 is a block diagram of a memory array.

With reference to FIG. 7, an exemplary structure of memory cell array 300 is described. As one example, a NAND flash EEPROM is described that is partitioned into 1,024 blocks. The data stored in each block can be simultaneously erased. In one embodiment, the block is the minimum unit of memory cells that are simultaneously erased. In each block, in this example, there are 8,512 columns corresponding to bit lines BL0, BL1 . . . BL8511. In one embodiment, all the bit lines of a block can be simultaneously selected during read and program operations. Memory cells along a common word line and connected to any bit line can be programmed at the same time.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

The lower portion of FIG. 7 shows a block i having four memory cells connected in series to form a NAND string, as previously described. Although four cells are shown to be included in each NAND string, more or less than four can be used (e.g., 8, 16, 32, 64, or another number). One terminal of the NAND string is connected to a corresponding bit line via drain select gate SGD, and another terminal is connected to the common source via source select gate SGS.

Each memory cell can store data represented in analog or digital form. When storing one bit of digital data, the range of possible threshold voltages of the memory cell is divided into two ranges, which are assigned logical data values "1" and "0." In one example of a NAND-type flash memory, the voltage threshold is negative after the memory cell is erased, and defined as logic "1." The threshold voltage is positive after a program operation, and defined as logic "0." When the threshold voltage is negative, and a read operation is initiated by applying 0 volts to the control gate, the memory cell will turn on to indicate that logic "1" is being stored in the cell. When the threshold voltage is positive, and a read operation is performed by applying 0 volts to the control gate, the memory cell will not turn on, which indicates that logic "0" is stored. A memory cell storing one bit of digital data is generally referred to as a binary memory cell.

A memory cell can also store multiple bits of digital data and can be referred to as a multi-state or multi-level cell. The threshold voltage window for a multi-state memory cell is divided into ranges. For example, if four states are used, then there will be four ranges of threshold voltages assigned to the logical data values "11," "10," "01," and "00." In one typical example of a NAND-type memory, the threshold voltage after an erase operation is negative and defined as "11." Positive threshold voltages are used for the states of "10," "01," and "00."

Generally, the techniques disclosed herein can be used with devices that are programmed and erased by Fowler-Nordheim tunneling. This disclosure is also applicable to devices that use the nitride layer of a triple layer dielectric, such as a dielectric formed of silicon oxide, silicon nitride and silicon oxide (ONO) to store charges instead of a floating gate. A triple layer dielectric formed of ONO is sandwiched between a conductive control gate and a surface of a semi-conductive substrate above the memory element channel. In some cases, more than three dielectric layers may be used. Other layers, such as aluminum oxide, may be used as well. An example of the latter is the Si-Oxide-SiN—$Al_2O_3$—TaN (TANOS) structure in which a triple layer of silicon oxide, silicon nitride and aluminum oxide is used. This disclosure can also be applied to devices that use, for example, small islands of conducting materials such as nano crystals as charge storage regions instead of floating gates. Such memory devices can be programmed and erased in a similar way as floating gate based NAND flash devices.

Figure 8:
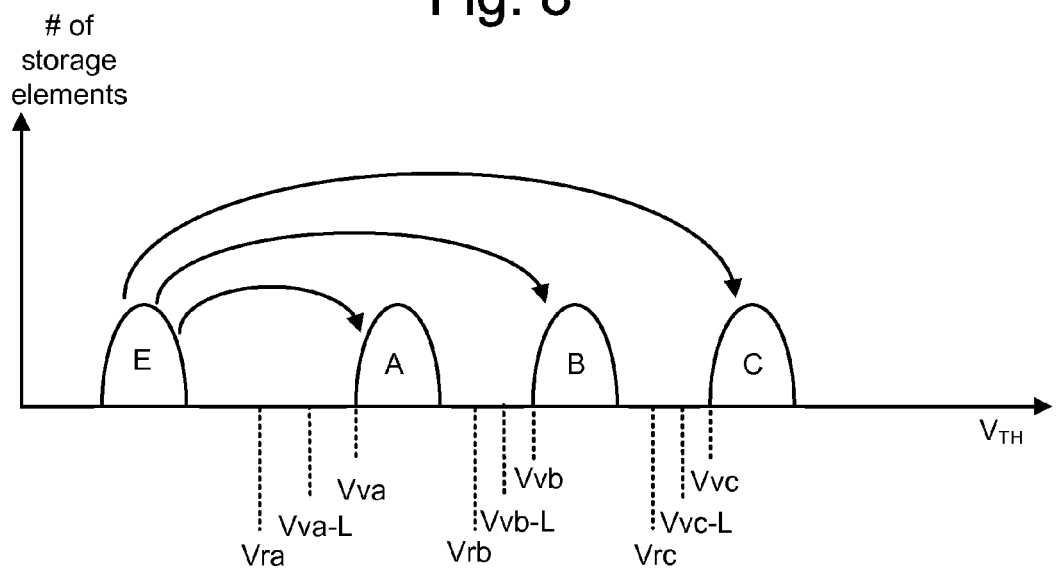
FIG. 8 depicts an example set of threshold voltage distributions.

At the end of a successful programming process, the threshold voltages of the memory cells should be within one of the distributions of threshold voltages for programmed memory cells or within the single distribution of threshold voltages for erased memory cells, as appropriate. FIG. 8 illustrates typical threshold voltage distributions for the storage element array when each storage element stores two bits of data, including a first threshold voltage distribution E for erased storage elements, and three additional threshold voltage distributions, A, B and C for programmed storage elements. In one embodiment, the threshold voltages in the E distribution are negative and the threshold voltages in the A, B and C distributions are positive.

Each distinct range of threshold voltages shown in FIG. 8 corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 entitled Novel Multi-State Memory, and U.S. Patent Publication No. 2004/0255090 entitled Tracking Cells For A Memory System, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns the logical value "11" to threshold voltage range E, logical value "10" to threshold voltage range A, logical value "00" to threshold voltage range B, and logical value "01" to threshold voltage range C. However, in other embodiments, Gray code is not used. Although FIG. 8 shows four states, the present invention can also be used with other multi-state structures and configurations including those that include more or less than four states.

FIG. 8 also shows three read reference voltages, $V_{ra}$, $V_{rb}$ and $V_{rc}$, and six verify reference voltages, $V_{va}$, $V_{va-L}$, $V_{vb}$, $V_{vb-L}$, $V_{vc}$, and $V_{vc-L}$. For a read operation, the threshold voltage of a storage element is measured and compared to the relevant reference voltage in order to determine what state the storage element is in. For a standard programming operation wherein storage elements are being programmed to state A, the threshold voltage is measured and compared to the verify voltage $V_{va}$. As long as the threshold voltage is below the verify voltage $V_{va}$, programming will continue for that element. When using a coarse/fine programming technique, a lower verify voltage $V_{va-L}$ is also used, and when the threshold voltage is between the two verify points, programming will be slowed down (partially inhibited). Similarly, for a standard programming operation wherein storage elements are being programmed to state B, the threshold voltage is measured and compared to the verify voltage $V_{vb}$. As long as the threshold voltage is below the verify voltage $V_{vb}$, programming will continue for that element. When using a coarse/fine programming technique, a lower verify voltage $V_{vb-L}$ is also used, and when the threshold voltage is between the two verify points, programming will be slowed down (partially inhibited). Likewise, for a standard programming operation wherein storage elements are being programmed to state C, the threshold voltage is measured and compared to the verify voltage $V_{vc}$. As long as the threshold voltage is below the verify voltage $V_{vc}$, programming will continue for that element. When using a coarse/fine programming technique, a lower verify voltage $V_{vc-L}$ is also used, and when the threshold voltage is between the two verify points, programming will be slowed down (partially inhibited).

In one embodiment, known as full sequence programming, storage elements can be programmed from the erase state E directly to any of the programmed states A, B or C. For example, a population of storage elements to be programmed may first be erased so that all storage elements in the population are in erased state E. While some storage elements are being programmed from state E to state A, other storage elements are being programmed from state E to state B and/or from state E to state C.

Figure 9:
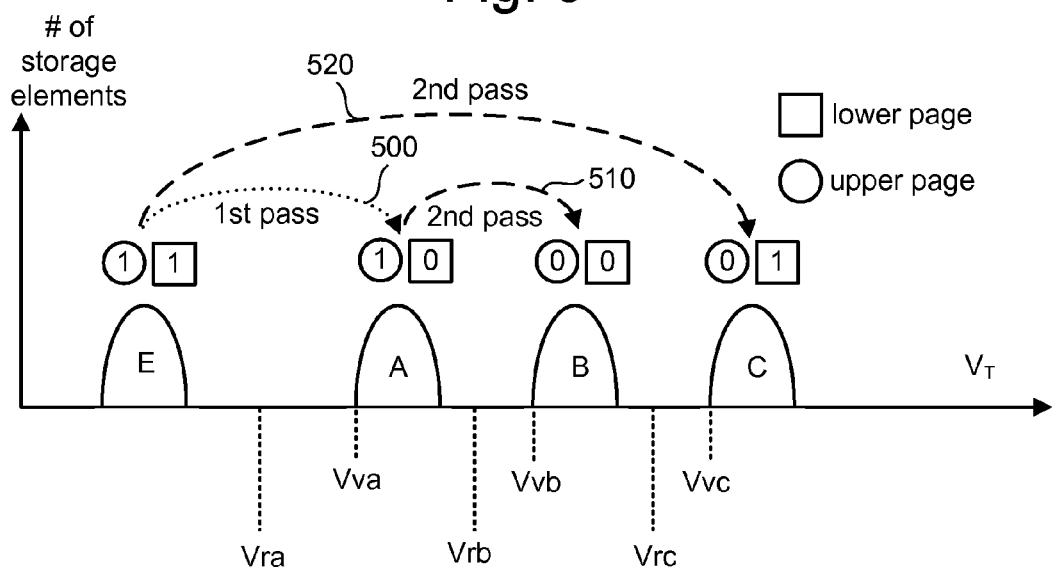
FIG. 9 illustrates a set of threshold voltage distributions for a two-pass programming technique.

FIG. 9 illustrates an example of a two-pass technique of programming a multi-state storage element that stores data for two different pages: a lower page and an upper page. Four states are depicted: state E (11), state A (10), state B (00) and state C (01). For state E, both pages store "1." For state A, the lower page stores "0" and the upper page stores "1." For state B, both pages store "0." For state C, the lower page stores "1" and the upper page stores "0." Note that although specific bit patterns have been assigned to each of the states, different bit patterns may also be assigned.

In a first programming pass, the threshold voltage level of the storage element is set according to the bit to be programmed into the lower logical page. If that bit is logic "1," the threshold voltage is not changed since it is in the appropriate state as a result of having been previously erased. However, if the bit to be programmed is logic "0," the threshold level of the storage element is raised to state A, as shown by arrow 500.

In a second programming pass, the storage element's threshold voltage level is set according to the bit being programmed into the upper logical page. If the upper logical page bit is to store logic "1," then no programming occurs since the storage element is in one of states E or A, depending upon the programming of the lower page bit, both of which carry an upper page bit of "1." If the upper page bit is to be logic "0," then the threshold voltage is shifted. If the first pass resulted in the storage element remaining in the erased state E, then in the second phase the storage element is programmed so that the threshold voltage is increased to be within state C, as depicted by arrow 520. If the storage element had been programmed into state A as a result of the first programming pass, then the storage element is further programmed in the second pass so that the threshold voltage is increased to be within state B, as depicted by arrow 510. The result of the second pass is to program the storage element into the state designated to store logic "0" for the upper page without changing the data for the lower page.

In one embodiment, a system can be set up to perform full sequence writing if enough data is written to fill up a word line. If not enough data is written, then the programming process can program the lower page with the data received. When subsequent data is received, the system will then program the upper page. In yet another embodiment, the system can start writing in the mode that programs the lower page and convert to full sequence programming mode if enough data is subsequently received to fill up most or all of the storage elements for an entire word line. More details of such an embodiment are disclosed in U.S. Patent Publication No. 2006/0126390 entitled Pipelined Programming of Non-Volatile Memories Using Early Data, incorporated herein by reference in its entirety.

Figure 10A:
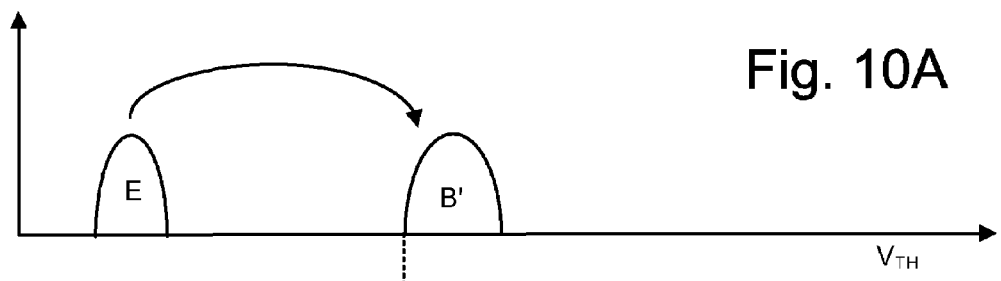
FIGS. 10A-C each illustrate a set of threshold voltage distributions for a programming technique that reduces floating gate to floating gate coupling.
Figure 10B:
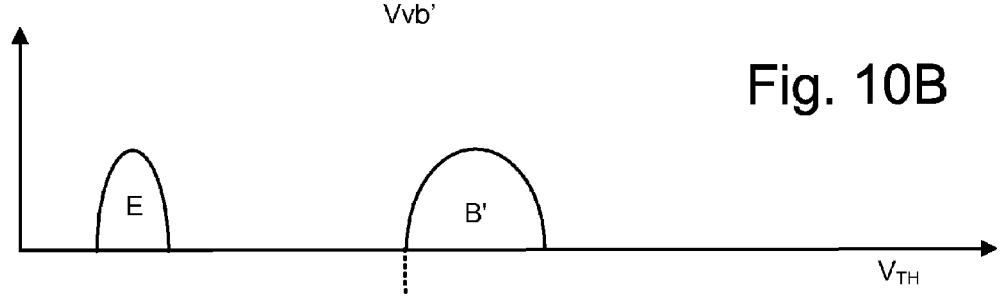
Figure 10C:
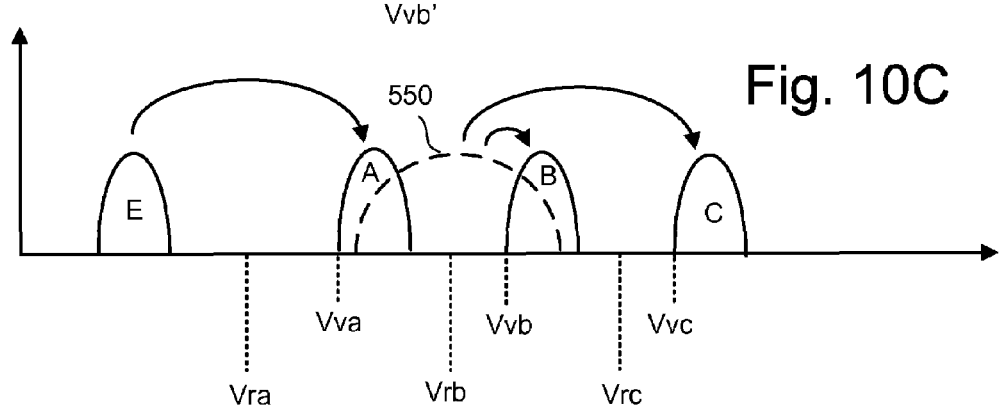

FIGS. 10A-10C depict another process for programming non-volatile memory that reduces floating gate-to-floating gate coupling for any particular memory element by writing to that particular memory element with respect to a particular page subsequent to writing to adjacent memory elements for previous pages. In one example implementation, each of the non-volatile memory elements stores two bits of data using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each memory element stores bits from two pages of data. For reference purposes, these pages of data will be called upper page and lower page; however, they can be given other labels. For state A, the upper page stores bit 0 and the lower page stores bit 1. For state B, the upper page stores bit 1 and the lower page stores bit 0. For state C, both pages store bit data 0. The lower page data for memory cells at a word line $WL_n$ are programmed in a first step depicted in FIG. 10A and upper page data for the cells is programmed in a second step depicted in FIG. 10C. If the lower page is to remain data 1, then the threshold voltage of the memory element state remains at state E during the first step. If the data is to be programmed to 0, then the threshold voltage $V_t$ of the memory cell is raised to state B'. State B' is an interim state B having a verify level Vvb', which is lower than Vvb.

In one embodiment, after the lower page data for the memory element is programmed from state E to state B', its neighboring memory element on adjacent word line $WL_{n+1}$ is programmed with respect to its lower page. For example, the lower page for memory cells on word line WL2 may be programmed after the lower page for memory cells on word line WL1. Floating gate coupling may raise the apparent threshold voltage of the target memory cell if the threshold voltage of the adjacent memory cell is raised from state E to state B' after programming the target memory cell. The cumulative coupling effect on the memory cells at $WL_n$ will widen the apparent threshold voltage distribution of threshold voltages for the cells, as depicted as in FIG. 10B. The apparent widening of the threshold voltage distribution can be remedied when programming the upper page for the word line of interest.

FIG. 10C depicts the process of programming the upper page for the memory element $WL_n$. If the memory element is in erased state E and the upper page bit is to remain at 1, then the memory element will remain in state E. If the memory element is in state E and its upper page data is to be programmed to 0, the threshold voltage of the memory element will be raised so that the memory element is in state A. If the memory element is in state B' with the intermediate threshold voltage distribution 550 and the upper page data is to remain at 1, the memory element will be programmed to final state B. If the memory element is in state B' with the intermediate threshold voltage distribution 550 and the upper page data is to become data 0, the threshold voltage of the memory element will be raised so that the memory element is in state C. The process depicted by FIGS. 10A-10C reduces the effect of floating gate-to-floating gate coupling because only the upper page programming of neighbor memory elements will have an effect on the apparent threshold voltage of a given memory element. An example of an alternate state coding for this technique is to move from intermediate state B' to state C when the upper page data is a 1, and to move to state B when the upper page data is a 0. Although FIGS. 10A-10C provide an example with respect to four data states and two pages of data, the concepts taught can be applied to other implementations with more or fewer than four states and more or fewer than two pages. More detail about various programming schemes and floating gate-to-floating gate coupling can be found in U.S. patent application Ser. No. 11/099,133 entitled Compensating For Coupling During Read Operations Of Non-Volatile Memory.

Figure 11A:
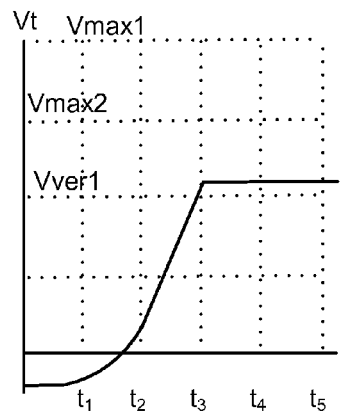
FIG. 11A illustrates a threshold voltage versus time relationship for a traditional programming process.
Figure 12A:
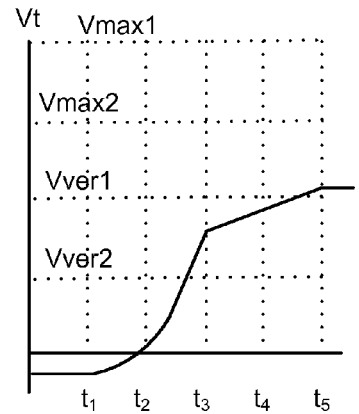
FIG. 12A illustrates a threshold voltage versus time relationship for a coarse/fine programming process.
Figure 13A:
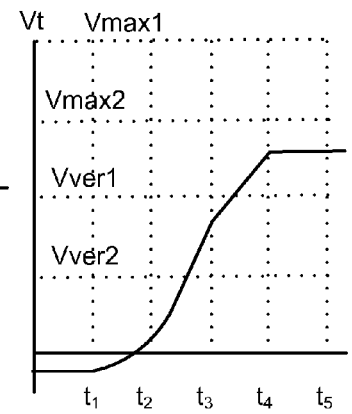
FIG. 13A illustrates a threshold voltage versus time relationship for a modified coarse/fine programming process.
Figure 11B:
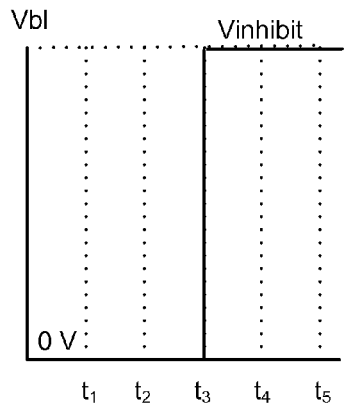
FIGS. 11B, 12B and 13B illustrate bit line voltage versus time relationships and correlate to FIGS. 11A, 12A and 13A, respectively.
Figure 12B:
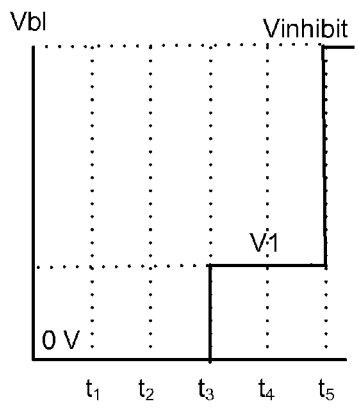
Figure 13B:
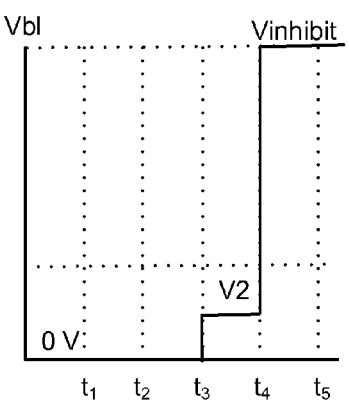

FIGS. 11-13 illustrate threshold voltages and bit line voltage during three different programming techniques that can be used to implement the programming processes of FIGS. 8-10. FIGS. 11A and 11B illustrate a standard or conventional programming process, FIGS. 12A and 12B illustrate a first coarse/fine programming process, and FIGS. 13A and 13B illustrate a modified coarse/fine programming process. The coarse/fine techniques are used for programming multi-level NAND storage elements, but can be used in programming binary devices as well.

FIG. 11A illustrates the relationship between threshold voltage and time for a standard programming process. A series of programming pulses are applied to selected control gates, as previously described. At certain time intervals or verify points during programming, $t_1$, $t_2$, $t_3$, etc., a verify operation is carried out in which the threshold voltage $V_t$ of the storage element is measured. If the measured threshold voltage $V_t$ of the selected storage element is lower than a predetermined verify level $V_{ver1}$, then programming continues for that storage element, and the bit line voltage $V_{b1}$ stays low, typically at 0 V, as shown in FIG. 11B. At time $t_3$, the storage element has reached a threshold voltage level above $V_{ver1}$, and the bit line voltage $V_{b1}$ is raised to an inhibit voltage $V_{inhibit}$, in order to fully inhibit further programming of the storage element. The inhibit voltage $V_{inhibit}$ is typically a relatively high voltage, such as the power supply voltage $V_{dd}$. This standard programming approach thus uses a single verify level, and programming of the storage element will continue until its threshold voltage $V_t$ reaches the verify level $V_{ver1}$, after which further programming is inhibited by raising the bit line voltage to a high inhibit voltage $V_{inhibit}$.

FIG. 12A illustrates the relationship between threshold voltage and time for a coarse/fine programming process. In this technique, two verify levels are used, and the storage element is partially inhibited from programming at time $t_3$ when it reaches a threshold voltage level that is in between the upper verify level $V_{ver1}$ and the lower verify level $V_{ver2}$. Thus, rather than raising the bit line voltage to a high voltage level, the bit line is raised to an intermediate voltage level $V_1$, typically on the order of about 0.5-1.0 V, which partially inhibits programming of the storage element as shown in FIG. 12B. The channel voltage during programming will also be about the same as $V_1$. At time $t_4$, the threshold voltage $V_t$ is still between the upper and lower verify levels, so the bit line voltage $V_{b1}$ remains at intermediate voltage $V_1$. At time $t_5$, however, the threshold voltage $V_t$ has increased to a voltage above the upper verify level $V_{ver1}$, at which time the bit line voltage is raised to $V_{inhibit}$ to fully inhibit programming. By using the coarse/fine programming processes, the programmed $V_t$ distribution is narrower than with the standard programming process because the threshold voltage shift of the storage element is reduced once the threshold voltage $V_t$ has come close to the target threshold voltage value of the desired programmed state.

FIG. 13A illustrates the relationship between threshold voltage and time for the modified coarse/fine programming process in which a different partial inhibit voltage $V_2$ is used on the bit line. In this example, as in FIG. 12A, the storage element is partially inhibited from programming at time $t_3$ when it reaches a $V_t$ state in between $V_{ver1}$ and $V_{ver2}$. At that time, the bit line voltage is raised to an intermediate voltage $V_2$. The value of $V_2$ is chosen so that at time $t_4$, after one additional programming pulse has been applied, the storage element reaches a $V_t$ above $V_{ver1}$, at which time $V_{b1}$ is raised from $V_2$ to $V_{inhibit}$ to fully inhibit programming. More information about the modified coarse/fine programming can be found in U.S. Patent Pub. 2005/0157552, "Programming Non-volatile Memory."

In order to obtain the best performance using the modified coarse/fine programming technique, the intermediate inhibit voltage $V_2$ should preferably be chosen in such a way that the shift in threshold voltage $V_t$ of the storage element during the next programming pulse equals $\Delta V_{pgm}/2$. If the verify limits $V_{ver1}$ and $V_{ver2}$ are chosen in an appropriate way, the $V_t$ of the storage element should then be higher than $V_{ver1}$ (the target value) after only one additional programming pulse. Thus, only one additional programming pulse is provided regardless of whether the threshold voltage $V_t$ of the storage element after that one additional pulse is higher or lower than the final target level $V_{ver1}$. An advantage of the modified coarse/fine programming process is that fewer programming pulses are needed than with the traditional coarse/fine programming process, resulting in a shorter programming time and reduced program disturb, especially when used for the highest programmed $V_t$ state.

In one embodiment, a coarse/fine programming technique is used for programming to lower states (e.g., states A and B) while using a standard technique (not coarse/fine programming) for programming to the highest state(s) (e.g., state C). However, when the programming of the lower states is finished, a number of programming pulses are still needed to program the highest state (e.g., state C). To improve the programming speed, a bigger step size and longer programming pulse can be used from the moment that the lowest states (e.g., states A and B) have been programmed. At the same time, the programming technique for the highest state can be changed to one of the coarse/fine programming techniques described above or otherwise known in the art. Thus, preferably, the programming method switches to a faster technique when the lower states have finished programming. This could unreasonably widen the threshold voltage distribution for the highest state, however, the switch to coarse/fine programming limits such widening of the voltage distribution for the highest state. It should also be noted that, in some cases, it is not necessary to wait until all memory cells have reached the A or B state. In fact, some memory cells may fail to successfully program to the A or B state. Therefore, the switch to a faster programming method should be initiated when all of the memory cells have reached the A or B state, or all memory cells except a predefined maximum number of erratic memory cells have reached the A or B state. The use of error correction can effectively correct erratic memory cells that failed to properly program, assuming there are not more than the predefined maximum. Therefore, for the purposes of this disclosure, the B state has finished or completed programming when all memory cells or all memory cells except a predefined maximum number of erratic memory cells have reached the B state.

Figure 14:
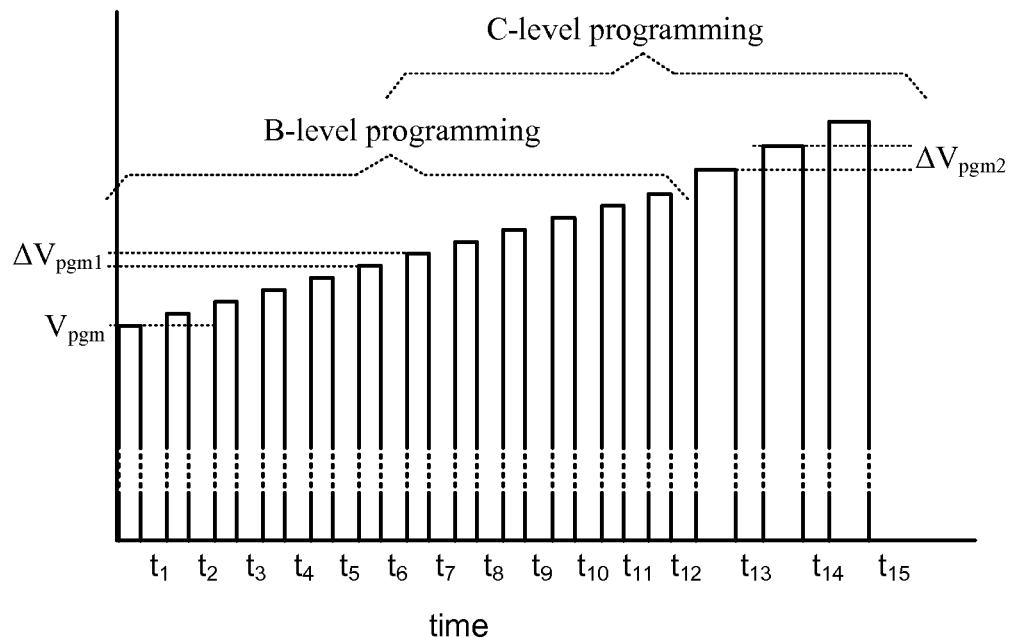
FIG. 14 illustrates a series of programming pulses for programming a multi-level non-volatile storage element.

FIG. 14 illustrates a sequence of programming pulse that may be used to achieve faster programming of the highest level(s) of a multi-level non-volatile storage element, as described immediately above. These figures show programming pulses for full sequence programming of a four-state device, although other methods could be used. The portion of the sequence labeled "B-level programming" pertains to the time when memory cells are being programmed to state B. They may also be programmed to states A and C (at least during a portion of the time). The portion of the sequence labeled "C-level programming" pertains to the time when memory cells are being programmed to state C. The "B-level programming" ends after time $t_{12}$, at which point all storage elements that are to be programmed to states A or B have reached the final target threshold voltage level and are now locked out from further programming. Additional programming at this point is only for storage elements to be programmed to state C, the highest state.

The initial program pulse $V_{pgm}$ is applied to selected storage elements. Each subsequent pulse is incremented by a pulse step $\Delta V_{pgm1}$. Between each programming pulse, one or more verify operations are carried out whereby a series of verify pulses, for example, as shown in FIG. 16, are applied to the storage element, and the threshold voltage $V_t$ is compared to appropriate verify levels to determine whether to continue or inhibit programming for a cell of interest.

When it is determined that the B state has completed programming (e.g., all or almost all of the storage elements that are to be programmed to states A or B have reached the final target threshold voltage level and are now locked out from further programming), then pulse sequences may be applied which permit faster programming of the C state. With reference to FIG. 14, the step size for the next pulse is increased from $\Delta V_{pgm1}$ (typ. 0.4 V) to $\Delta V_{pgm2}$ (typ. 0.8 V). Preferably, $\Delta V_{pgm2}$ is about twice as large as $\Delta V_{pgm1}$. In addition, at the same time that the step size is adjusted, the length of the programming pulse is increased. For example, a typical pulse length for the prior programming methods is 10 μsec, and the increased pulse length could be 20 μsec, although these values will vary based on implementation. Further, instead of using a conventional programming method for the C state programming, wherein a standard write method with a single verify level is used, as shown in FIG. 16, a coarse/fine programming method with two verify levels can be used, as shown in FIG. 17. Thus, for elements being programmed to the C state, the threshold voltage $V_t$ is compared to verify levels $V_{vc}$ and $V_{vc-L}$ (where $V_{vc}>V_{vc-L}$). If $V_t<V_{vc-L}$, then programming continues. If $V_{vc}>V_t>V_{vc-L}$, then an intermediate voltage is applied to the bit line to slow down programming. When $V_t>V_{vc}$, then a high voltage is applied to the bit line to inhibit further programming. Note that in some embodiments, it is not necessary to switch to a coarse/fine programming method at the same time that pulse length and width are increased. In some cases, it may be acceptable to continue using a single verify level since the resulting wider Vt distribution for the C-state may be acceptable. In this way, the number of verify operations can be reduced thereby resulting in faster programming.

Figure 15:
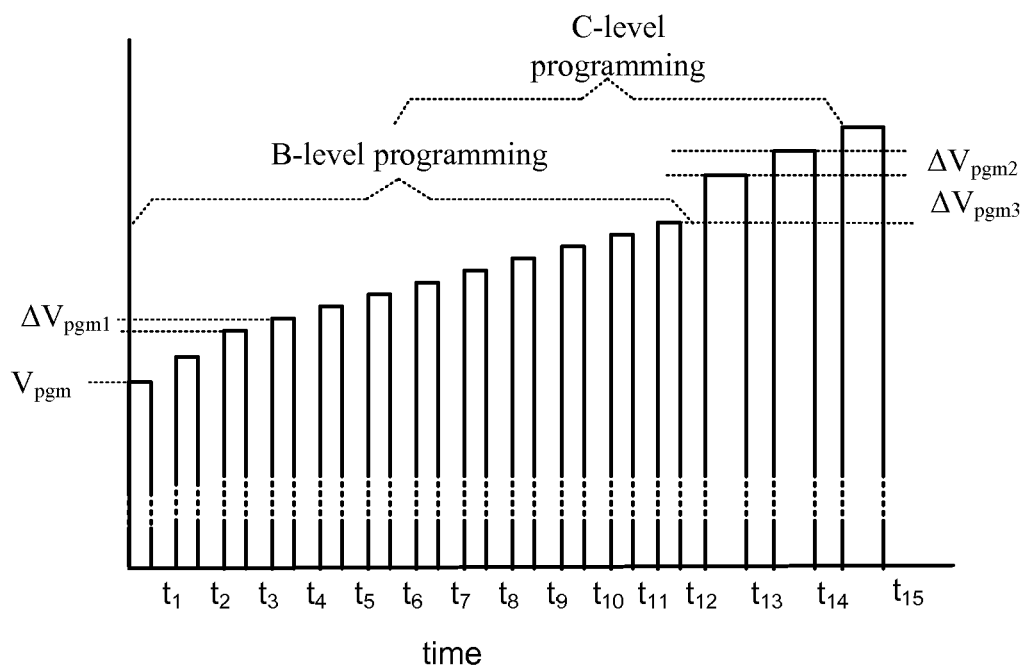
FIG. 15 illustrates a series of programming pulses for programming a multi-level non-volatile storage element.

FIG. 15 is similar to FIG. 14, except that after the B state has finished programming, the next pulse is increased by step size $\Delta V_{pgm3}$ (typ. 1.2V), but then followed by pulses with step size $\Delta V_{pgm2}$ (type 0.8 V). Preferably, $\Delta V_{pgm3}$ is greater than $\Delta V_{pgm2}$. Note that during the programming of the B state, some of the fastest cells will have reached the C state already. Those C state cells are thus programmed with a small step size $\Delta V_{pgm1}$, and the coarse/fine method is not needed for these cells. However, when all or almost all of the B state cells have finished programming, both the step size and the verify method are changed. The step size increases, and instead of using a normal write method with only one verify level, as in FIG. 16, the programming switches to a coarse/fine method using two verify levels, as shown in FIG. 17. It is preferred that the modified quick pass write method be used to write the C state in order to limit the program disturb as well as the number of programming pulses. As previously mentioned, however, in some embodiments it may not be necessary to change the verify method as the resulting wider Vt distribution for the C state may be acceptable.

Figure 16:
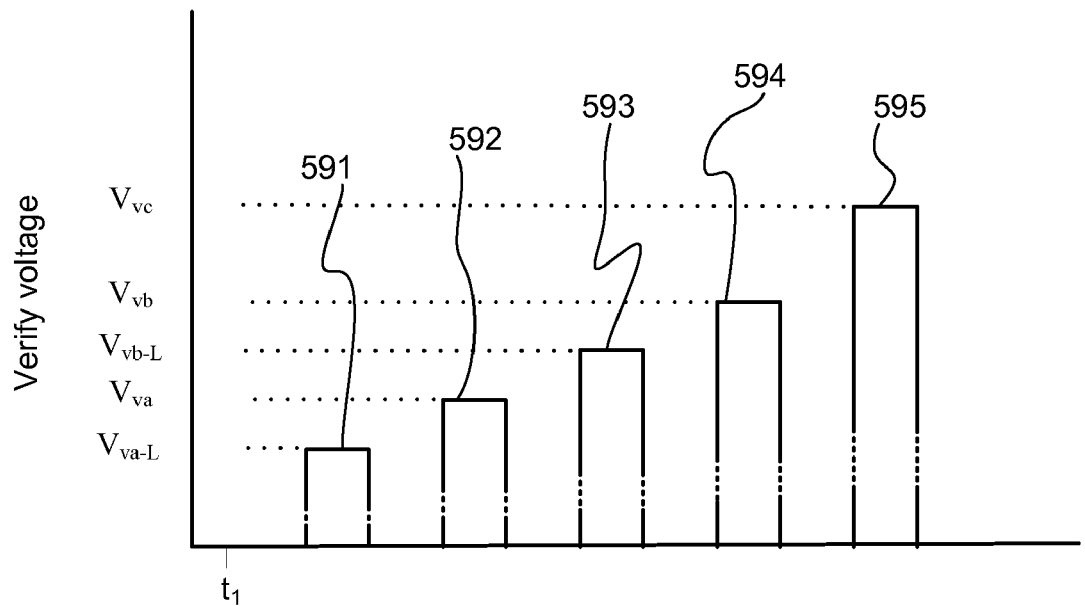
FIG. 16 illustrates a series of verify pulses used to verify the programming of storage elements before the lowest states have completed programming.
Figure 17:
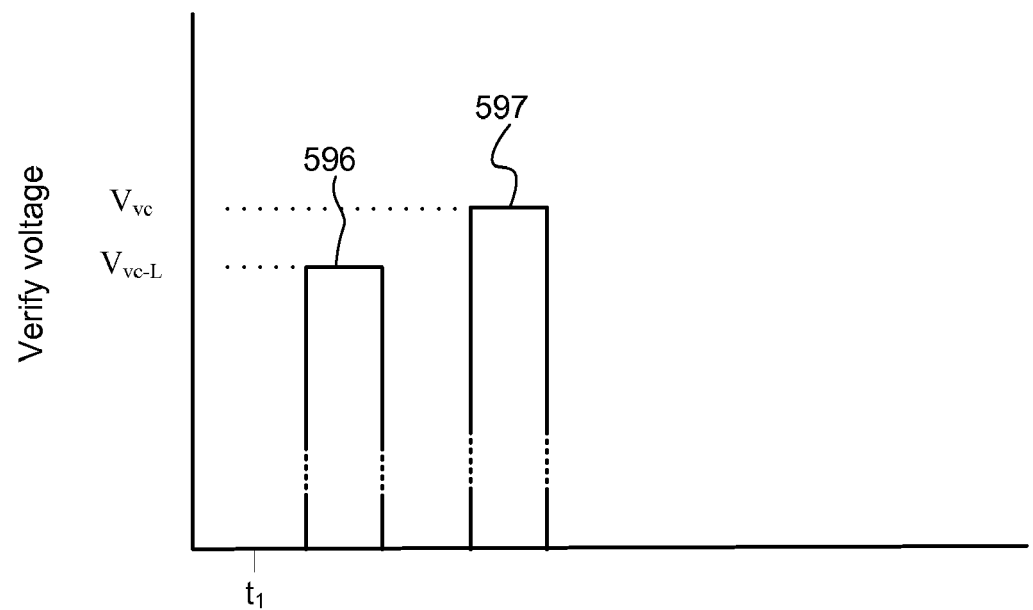
FIG. 17 illustrates a series of verify pulses used to verify the programming of storage elements after the lowest states have completed programming.

For the time intervals $t_1$-$t_{11}$, the set of verify pulses depicted in FIG. 16 is applied. In this example, the set of verify pulses includes five pulses. The first pulse 591 has a magnitude $V_{va-L}$ for checking the lower verify level for the A state. The second pulse 592 has a magnitude $V_{va}$ for checking the upper verify level for the A state. The third pulse 593 has a magnitude $V_{vb-L}$ for checking the lower verify level for the B state. The fourth pulse 594 has a magnitude $V_{vb}$ for checking the upper verify level for the B state. The fifth pulse 595 has a magnitude $V_{vc}$ for checking the single verify level for the C state. Thus, while the lower states are being programmed, a coarse/fine technique with two verify levels is used to program the lower states A and B, while a standard technique with a single verify level is used to program the highest state C. In some cases, not all five verify operations are performed after each programming pulse. For example, it is very unlikely that any cells will have reached the C state after the first programming pulse at t1, so the C verify operation may be postponed for a predetermined number of pulses and then started after the predetermined number of programming pulses have finished. Various techniques can be used to reduce the total required number of verify operations.

At interval $t_{12}$, the system confirms that lower states A and B have completed programming, and a different set of verify pulses is applied to implement a coarse/fine verify technique for programming state C, as shown in FIG. 17. Because the A and B states have completed programming, there is only a need for verify pulses to check state C, and therefore the modified set of verify pulses includes a first pulse 596 with magnitude $V_{vc-L}$ for checking the lower verify level for the C state, and a second pulse 597 with magnitude $V_{vc}$ for checking the upper verify level for the C state. Note that, as previously mentioned, in some embodiments it may be acceptable to skip the first pulse 596 for checking the lower verify level for the C state, and thus only verifying the C state with pulse 597. This reduces the total number of required verify operations and will thus reduce the total programming time at the expense of a wider C state Vt distribution.

Performing multiple verify operations after each programming pulses slows down the programming process. One means for reducing the time burden of verifying is to use a more efficient verify process. For example, in U.S. Pat. No. 7,073,103 entitled Smart Verify for Multi-State Memories, incorporated herein by reference in its entirety, a so-called "Smart Verify" process is disclosed. In an exemplary embodiment of the write sequence for a multi-state memory during a program/verify sequence using the Smart Verify process, at the beginning of the process, only the lowest state (e.g. state A) of the multi-state range to which the selected memory cells are being programmed is checked during the verify phase. Once the first storage state (e.g. state A) is reached by one or more of the memory cells, the next state (e.g. state B) in the sequence of multi-states is added to the verify process. This next state can either be added immediately upon the fastest cells reaching this preceding state in the sequence or, since memories are generally designed to have several programming steps to move from state to state, after a delay of several cycles. The amount of delay can either be fixed or use a parameter-based implementation, which allows the amount of delay to be set according to device characteristics. The adding of states to the set being checked in the verify phase continues as per above until the highest state has been added. Similarly, lower states can be removed from the verify set as all of the memory cells bound for these levels verify successfully to those target values and are locked out from further programming.

In FIGS. 14 and 15, during the programming of the B state, some of the fastest cells will have reached the C state already, and those C state cells will have been programmed with the smaller step size $\Delta V_{pgm1}$. The coarse/fine method is thus not needed for these cells. However, the key to these new techniques is that when all B state cells have finished programming, the pulse step size and pulse length are increased, and preferably, the programming switches to a coarse/fine method using two verify levels in order to maintain approximately the same C state Vt distribution width as with the prior art method. As mentioned above, in some embodiments it may not be necessary to switch to a coarse/fine method as the resulting wider C state Vt distributions can be tolerated in some cases.

Figure 18:
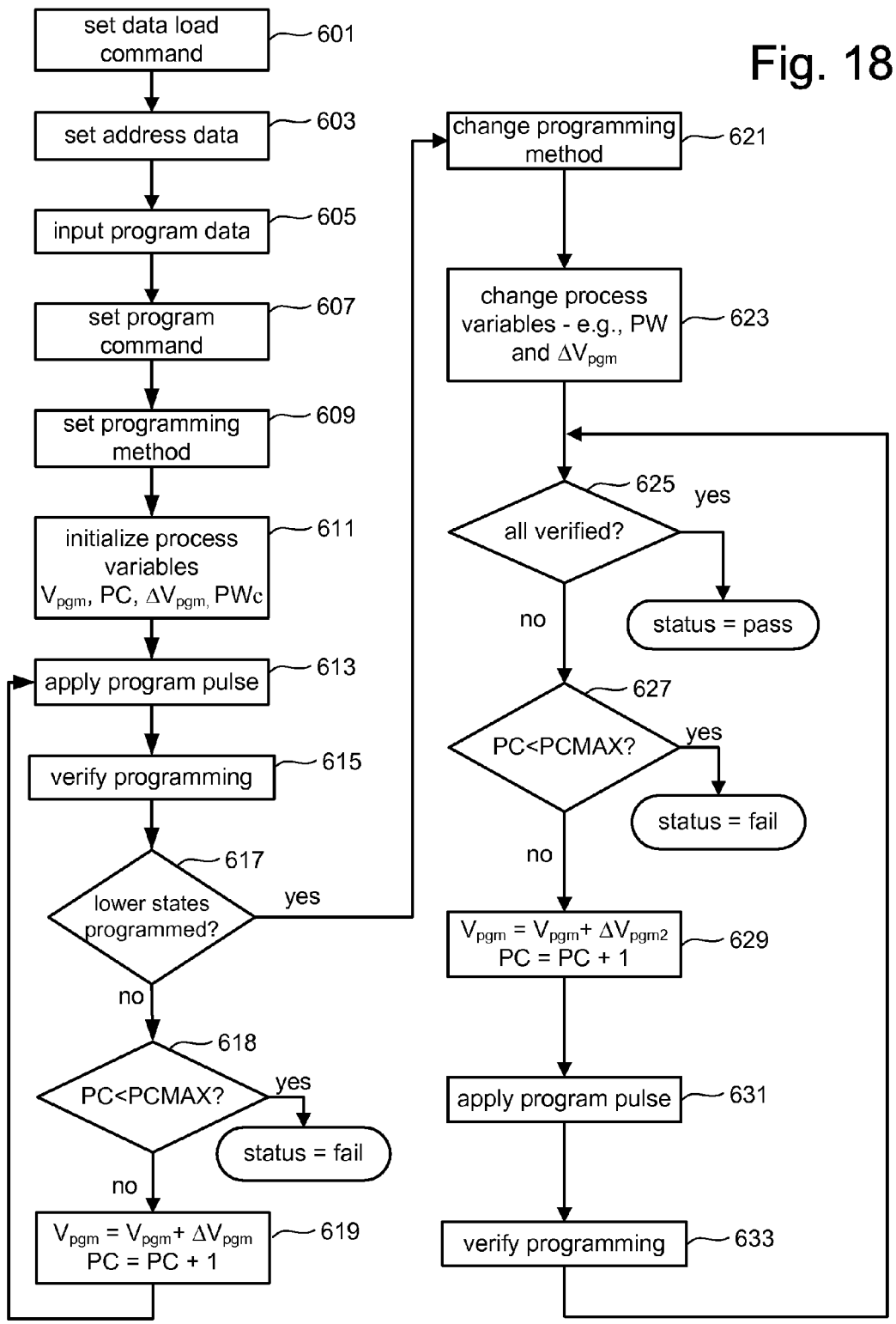

FIG. 18 is a flow chart describing one embodiment of a method for programming non-volatile memory, for example, as disclosed in FIG. 14. In some implementations, memory cells are erased (in blocks or other units) prior to programming. Typically, memory cells are erased by raising the p-well to an erase voltage (e.g., 18 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side, typically by the Fowler-Nordheim tunneling mechanism. As electrons are transferred from the floating gate to the p-well region, the threshold voltage of a selected cell is lowered. Erasing can be performed on the entire memory array, separate blocks, or another unit of cells.

In step 601 of FIG. 18, a "data load" command is issued by the controller and received by control circuitry 310. In step 603, address data designating the page address is input to decoder 314 from the controller or host. In step 605, a page of program data for the addressed page is input to a data buffer for programming. That data is latched in the appropriate set of latches. In step 607, a "program" command is issued by the controller to state machine 312.

Triggered by the "program" command, the data latched in step 605 will be programmed into the selected memory cells controlled by state machine 312 using stepped pulses applied to the appropriate selected word line. In step 609, the programming method is set. For example, a coarse/fine programming method is set for memory cells to be programmed to states A and B, while a standard method (not coarse/fine programming) is set for memory cells to be programmed to state C. In step 611, process variables are initialized. Thus, program voltage $V_{pgm}$ is initialized to a starting pulse magnitude (e.g., 12V or other value), the length of the pulses PW is set to an initial value (e.g., 10 µsec), the pulse step size $\Delta V_{pgm}$ is set to $\Delta V_{pgm1}$ (e.g., 0.4V) and a program counter PC maintained by state machine 312 is initialized to 0.

In step 613, the programming pulse $V_{pgm}$ is applied to the selected word line, as per FIG. 14. If a memory cell should be programmed, then the corresponding bit line is grounded. On the other hand, if a memory cell should remain in its current data state, then the corresponding bit line is connected to $V_{dd}$ to inhibit programming.

In step 615, the selected memory cells are verified to determine whether they have been completely programmed. If it is detected that the target threshold voltage of a selected cell has reached the appropriate level, then the memory cell is locked out from further programming. If it is detected that the threshold voltage has not reached the appropriate level, then the memory cell is not locked out from further programming. In step 617, the system checks to see whether the lower states have been programmed. In one embodiment, the lower states are all programmed states except the highest state. In the example of FIG. 8, the low states are states A and B. Thus, the system would determine whether all or almost all memory cells that are to be programmed to states A and B have completed their programming. In other embodiments, the set of lower states could include a different set of states. If it is determined that all or almost all memory cells that are to be programmed to the lower states have not completed their programming, then in step 618, the program counter PC is compared to PCMAX. If the program counter PC is less than PCMAX, then in step 619, the magnitude of the program pulses $V_{pgm}$ are increased by the step size and the program counter PC is increased by 1. After step 619, the process loops back to step 613 and another program pulse is applied to the selected word line. If the program counter PC is not less than PCMAX, then the programming process has failed.

If it is determined that all or almost all memory cells that are to be programmed to the lower states have completed their programming, then in step 621, the programming method is changed so that a coarse/fine programming method is used for those memory cells being programmed to the higher state or states (e.g., state C of FIG. 8). As mentioned before, this step is optional and may not be required in all embodiments. In step 623, the process variables are changed so that the width PW of the pulses is increased (e.g. is increased to 20 μsec) and the step size $\Delta V_{pgm}$ is increased (e.g., to $\Delta V_{pgm2}$—such as 0.8 v instead of 0.4 v). In step 625, it is determined whether all or almost all of the memory cells are verified to have completed programming. If so, the programming process has successfully completed. If not, then the programming process continues to step 627, where the program counter PC is checked against a program limit value PCMAX. One example of a program limit value is twenty; however, other numbers can also be used. If the program counter PC is not less than twenty, then the program process has failed. In many embodiments, after the maximum number of loops is reached, the system checks to see whether less than a predetermined amount of cells have not finished programming. If less than the predetermined number of cells have not finished programming, then the programming process will still be considered a pass. If the program counter PC is less than PCMAX, then in step 629, the process variables are updated. The program voltage $V_{pgm}$ is increased by a step size $\Delta V_{pgm2}$. The program counter PC is incremented. In step 631 the next programming pulse is applied and in step 633 the memory cells are verified to determine whether they have completed programming. After step 633, the process loops back to step 625. Note that in step 629 the program counter PC is increased by one. However, since the program voltage $V_{pgm}$ is increased by a larger step size, it may be preferred in some embodiments to increase the program counter PC by two (or a larger number) to reflect the change in $V_{pgm}$ step size.

FIG. 19 is a flow chart describing an embodiment of a method for programming non-volatile memory, as disclosed in FIG. 15. Steps 601-619 are the same as in FIG. 18. If, in step 617, it is determined that all or almost all memory cells that are to be programmed to the lower states have completed their programming, then in step 645 it is determined whether all or almost all of the memory cells are verified to have completed programming. If so, the programming process has successfully completed. If not, then the programming process continues to step 647 in which the programming method is changed so that a coarse/fine programming method is used for those memory cells being programmed to the higher state or states (e.g., state C of FIG. 8). As mentioned before, this is an optional step and may not be required in all embodiments. In step 649, the process variables are changed so that the width PW of the pulses is increased (e.g. is increased to 20 μsec) and the step size $\Delta V_{pgm}$ is increased (e.g., to $\Delta V_{pgm3}$, such as 1.2 v instead of 0.4 v). In step 651, the process variables are updated. The program voltage $V_{pgm}$ is increased by a step size $\Delta V_{pgm2}$. The program counter PC is incremented. Note that in step 651 the program counter PC is increased by one. However, since the program voltage $V_{pgm}$ is increased by a larger step size, it may be preferred in some embodiments to increase the PC by two (or a larger number) to reflect the change in $V_{pgm}$ step size. In step 653, the next program voltage pulse (with the new magnitude) is applied to the selected word line. In step 655, the selected memory cells are verified to determine whether they have been completely programmed. In step 657 it is determined whether all or almost all of the memory cells are verified to have completed programming. If so, the programming process has successfully completed. If not, then the programming process continues to step 659, where the program counter PC is checked against a program limit value PCMAX. If the program counter PC is not less than PCMAX, then the program process has failed. If the program counter PC is less than PCMAX, then in step 661, the process variables are updated. The program voltage $V_{pgm}$ is increased by a step size $\Delta V_{pgm2}$. The program counter PC is incremented. Note that in step 661, the program counter PC is increased by one. However, since the program voltage $V_{pgm}$ is increased by a larger step size, it may be preferred in some embodiments to increase the PC by two (or a larger number) to reflect the change in $V_{pgm}$ step size. After step 661, the process loops back to step 653 and the next program pulse is applied.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A method for programming a set of non-volatile storage elements, comprising:
applying a series of programming pulses to the non-volatile storage elements, wherein each successive pulse is incremented by a first step size until programming of lower states is completed, then each successive pulse is incremented by a second step size, wherein the second step size is larger than the first step size; and
increasing a pulse length of the programming pulses when programming of lower states is completed.

2. A method for programming a set of non-volatile storage elements, comprising:
applying a series of programming pulses to the non-volatile storage elements, including programming toward a highest state using a first technique that does not use coarse/fine programming until programming of lower states is completed, and programming toward the highest state using a coarse/fine technique after programming of lower states is completed, wherein each successive pulse is incremented by a first step size until programming of lower states is completed, then each successive pulse is incremented by a second step size; and
increasing a pulse length of the programming pulses when programming of lower states is completed.

3. The method of claim 2, wherein programming using the first technique includes using a single verify level, and programming using the coarse/fine technique includes using at least two verify levels.

4. The method of claim 3, wherein the coarse/fine technique includes applying an intermediate bit line voltage to storage elements having a threshold voltage that exceeds a first verify level but is less than a second verify level.

5. The method of claim 3, wherein the coarse/fine technique includes applying a high bit line voltage to storage elements having a threshold voltage that exceeds a second verify level.

6. The method of claim 2, wherein each storage element is capable of being programmed to an empty state and three programmed states, wherein one of the programmed states is a highest state, further comprising:

applying a first set of verify pulses to the storage elements until the lower states are programmed, then applying a second set of verify pulses to the storage elements, wherein the first set of verify pulses includes at least two verify levels for the lower states and a single verify level for the highest state, and wherein the second set of verify pulses includes at least two verify levels for the highest state.

7. The method of claim 6, wherein the step of applying a series of programming pulses increments each successive pulse by the first step size until programming of lower states is completed, then increments a single pulse by a third step size, then increments each successive pulse by the second step size.

8. The method of claim 7, wherein the third step size and the second step size are larger than the first step size.

9. The method of claim 8, wherein the third step size is larger than the second step size.

10. The method of claim 9, wherein the second step size is substantially twice as large as the first step size, and wherein the third step size is substantially three times as large as the first step size.

11. The method of claim 2, wherein the second step size is substantially twice as large as the first step size.

12. The method of claim 2, wherein a first programming pulse having increased pulse length is incremented by a third step size, and subsequent programming pulses having increased pulse length are incremented by the second step size.

13. The method of claim 2, wherein the increasing step doubles the pulse length.

14. The method of claim 2, wherein the applying step further comprises:
programming lower states using the coarse/fine technique.

15. The method of claim 14, wherein the step of applying a series of programming pulses increments each successive pulse by the first step size until programming of lower states is completed, then increments a single pulse by a third step size, then increments each successive pulse by the second step size.

16. A method for programming non-volatile storage elements, wherein each of the storage elements has multiple states for storing data, each state being defined as a unique range of threshold voltages, comprising:
applying a first series of programming pulses to the storage elements, each successive pulse being incremented by a first step size, until programming of lower states is completed;
increasing a pulse length of the programming pulses; and
applying a second series of programming pulses to the storage elements after programming of lower states is completed, each programming pulse having the increased pulse length, and each successive pulse being incremented by a second step size;
wherein the second step size is larger than the first step size.

17. The method of claim 16, wherein a first programming pulse of the second series is incremented by a third step size, and subsequent programming pulses in the second series are incremented by the second step size.

18. The method of claim 16, wherein:
the first series of programming pulses uses a coarse/fine technique for lower states and a first technique for higher states, and
the second series of programming pulses uses a coarse/fine technique for the higher states.

19. A method for programming non-volatile storage elements, each element having multiple states for storing data, each state corresponding to a range of threshold voltages, comprising:
for lower states, applying a first series of program voltage pulses to the storage elements, each pulse having a first pulse length and each successive pulse in the first series being incremented by a first step size until programming of the lower states is completed; and
for one or more higher states, applying the first series of program voltage pulses to the storage elements and subsequently applying a second series of program voltage pulses to the storage elements, each pulse of the second series having a second pulse length and each successive pulse in the second series being incremented by a second step size, wherein the second pulse length is greater than the first pulse length.

20. The method of claim 19, wherein a first program voltage pulse of the second series is incremented by a third step size, and subsequent program voltage pulses in the second series are incremented by the second step size.

21. The method of claim 19, further comprising:
verifying programming for the first series of programming pulses using a coarse/fine technique for lower states and a first technique for higher states, and
verifying programming for the second series of programming pulses using a coarse/fine technique for higher states.

22. A method for programming non-volatile storage elements, each element having multiple states for storing data, each state corresponding to a range of threshold voltages, comprising:
applying a first series of program voltage pulses to the storage elements, each pulse having a first pulse length and each successive pulse in the first series being incremented by a first step size until programming of the lower states is completed;
verifying programming of lower states using at least two verify levels;
verifying programming of higher states using a single verify level until programming of the lower states is completed;
applying a second series of program voltage pulses to the storage elements after programming of the lower states is completed, each pulse having a second pulse length and each successive pulse in the second series being incremented by a second step size, wherein the second pulse length is greater than the first pulse length; and
verifying programming of higher states using at least two verify levels.

23. The method of claim 22, wherein the step of verifying programming using at least two verify levels includes applying an intermediate bit line voltage to storage elements having a threshold voltage that exceeds a first verify level but is less than a second verify level.

24. The method of claim 22, wherein the step of verifying programming using at least two verify levels includes applying a high bit line voltage to storage elements having a threshold voltage that exceeds a second verify level.

25. A method for programming a set of non-volatile storage elements, comprising:
applying a series of programming pulses to the non-volatile storage elements, wherein each successive pulse is incremented by a first step size until programming of lower states is completed, then each successive pulse is incremented by a second step size, wherein the second step size is larger than the first step size;

increasing a pulse length of the programming pulses when programming of lower states is completed; and changing a programming scheme for a subset of said non-volatile storage elements that are targeted to one or more higher states after programming of lower states is completed.

26. A non-volatile storage system, comprising:

a plurality of non-volatile storage elements; and at least one managing circuit in communication with the non-volatile storage elements, wherein the managing circuit applies a series of programming pulses to the storage elements, each successive pulse being incremented by a first step size until programming of lower states is completed, then each successive pulse being incremented by a second step size, wherein the second step size is larger than the first step size, and wherein the managing circuit increases a pulse length of the programming pulses when programming of lower states is completed.

27. The system of claim 26, wherein the managing circuit programs a highest state using a first technique until programming of lower states is completed, then programs the highest state using a second technique after programming of lower states is completed.

28. The system of claim 27, wherein the first technique includes a single verify level, and the second technique includes at least two verify levels.

29. The system of claim 28, wherein:

the first technique does not use coarse/fine programming and the second technique uses coarse fine programming.

30. The system of claim 28, wherein for the second technique, the managing circuit applies a high bit line voltage to storage elements having a threshold voltage that exceeds a target verify level.

31. The system of claim 26, wherein each storage element is capable of being programmed to an empty state and three programmed states, wherein one of the programmed states is a highest state, and wherein the managing circuit applies a first set of verify pulses to the storage elements until the lower states are programmed, then applies a second set of verify pulses to the storage elements, wherein the first set of verify pulses includes at least two verify levels for the lower states and a single verify level for the highest state, and wherein the second set of verify pulses includes at least two verify levels for the highest state.

32. The system of claim 31, wherein the managing circuit increments each successive programming pulse by the first step size until programming of lower states is completed, then increments a single pulse by a third step size, then increments each successive pulse by the second step size.

33. The system of claim 32, wherein the third step size and the second step size are larger than the first step size.

34. The system of claim 33, wherein the third step size is larger than the second step size.

35. The system of claim 34, wherein the second step size is substantially twice as large as the first step size, and wherein the third step size is substantially three times as large as the first step size.

36. The system of claim 26, wherein the second step size is substantially twice as large as the first step size.

37. The system of claim 26, wherein the managing circuit increments a first programming pulse of the series having an increased pulse length by a third step size, and subsequent programming pulses in the series are incremented by the second step size.

38. The system of claim 26, wherein the managing circuit doubles the pulse length when programming of lower states is completed.

39. The system of claim 26, wherein the managing circuit programs lower states using a coarse/fine technique, programs higher states using a first technique until programming of lower states is completed, and programs higher states using a coarse/fine technique after programming of lower states is completed.

40. The system of claim 39, wherein the managing circuit increments each successive pulse by the first step size until programming of lower states is completed, then increments a single pulse by a third step size, then increments each successive pulse by the second step size.

41. A non-volatile storage system, comprising:

a plurality of non-volatile storage elements; and at least one managing circuit in communication with the non-volatile storage elements, wherein the managing circuit applies a first series of programming pulses to the storage elements, each successive pulse being incremented by a first step size until programming of lower states is completed, increases a pulse length of the programming pulses, and applies a second series of programming pulses to the storage elements, each programming pulse in the second series having the increased pulse length, and each successive pulse in the second series being incremented by a second step size, wherein the second step size is larger than the first step size.

42. The system of claim 41, wherein the managing circuit increments a first programming pulse of the series having an increased pulse length by a third step size, and subsequent programming pulses in the series are incremented by the second step size.

43. The system of claim 41, wherein the managing circuit verifies programming for the first series of programming pulses using a coarse/fine technique for lower states and a first technique for higher states, and verifies programming for the second series of programming pulses using a coarse/fine technique for higher states.

44. A system for programming a plurality of non-volatile storage elements, each element having multiple states for storing data, each state corresponding to a range of threshold voltages, comprising at least one managing circuit in communication with the non-volatile storage elements, wherein for lower states, the managing circuit applies a first series of program voltage pulses to the storage elements, each pulse having a first pulse length and each successive pulse in the first series being incremented by a first step size until programming of the lower states is completed, and wherein for higher states, the managing circuit applies a second series of program voltage pulses to the storage elements, each pulse having a second pulse length and each successive pulse in the second series being incremented by a second step size, wherein the second pulse length is greater than the first pulse length.

45. The system of claim 44, wherein the managing circuit increments a first program voltage pulse of the second series by a third step size, and subsequent program voltage pulses in the second series are incremented by the second step size.

46. The system of claim 44, wherein the managing circuit verifies programming for the first series of programming pulses using a coarse/fine technique for lower states and a first technique for higher states, and verifies programming for the second series of programming pulses using a coarse/fine technique for higher states.

47. A non-volatile storage system, comprising:

a plurality of non-volatile storage elements; and at least one managing circuit in communication with the non-volatile storage elements, wherein the managing circuit applies a first series of program voltage pulses to the storage elements, each pulse having a first pulse length and each successive pulse in the first series being incremented by a first step size until programming of the lower states is completed, verifies programming of lower states using at least two verify levels, and verifies programming of higher states using a single verify level, and wherein the managing circuit applies a second series of program voltage pulses to the storage elements, each pulse having a second pulse length and each successive pulse in the second series being incremented by a second step size, wherein the second pulse length is greater than the first pulse length, and verifies programming of higher states using at least two verify levels.

48. The system of claim 47, wherein the managing circuit applies an intermediate bit line voltage to storage elements having a threshold voltage that exceeds a first verify level but is less than a second verify level.

49. The system of claim 47, wherein the managing circuit applies a high bit line voltage to storage elements having a threshold voltage that exceeds a second verify level.

\* \* \* \* \*